United States Patent
Sun Zhou et al.

(10) Patent No.: US 12,142,567 B2
(45) Date of Patent: Nov. 12, 2024

(54) CORELESS ARCHITECTURE AND PROCESSING STRATEGY FOR EMIB-BASED SUBSTRATES WITH HIGH ACCURACY AND HIGH DENSITY

(71) Applicant: Intel Corporation, Santa Clara, CA (US)

(72) Inventors: Xiao Di Sun Zhou, Tempe, AZ (US); Debendra Mallik, Chandler, AZ (US); Xiaoying Guo, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 1056 days.

(21) Appl. No.: 16/387,167

(22) Filed: Apr. 17, 2019

(65) Prior Publication Data
US 2020/0335443 A1    Oct. 22, 2020

(51) Int. Cl.
*H01L 23/538* (2006.01)
*H01L 21/48* (2006.01)
(Continued)

(52) U.S. Cl.
CPC ...... *H01L 23/5381* (2013.01); *H01L 21/4853* (2013.01); *H01L 21/4857* (2013.01);
(Continued)

(58) Field of Classification Search
CPC ............. H01L 23/5381; H01L 23/5389; H01L 23/486; H01L 23/49827; H01L 23/5384;
(Continued)

(56) References Cited

U.S. PATENT DOCUMENTS

| | | | |
|---|---|---|---|
| 7,928,557 B2 * | 4/2011 | Oi | H05K 3/3447 257/E23.024 |
| 7,947,906 B2 * | 5/2011 | Lee | H05K 1/185 29/847 |
| 8,004,074 B2 * | 8/2011 | Mori | H01L 23/295 257/E23.101 |
| 9,232,657 B2 * | 1/2016 | Kiwanami | H05K 1/185 |

(Continued)

FOREIGN PATENT DOCUMENTS

| | | | | |
|---|---|---|---|---|
| DE | 102020119181 A1 * | 4/2021 | | H01L 21/4853 |
| EP | 3474639 A1 * | 4/2019 | | H01L 21/4857 |

*Primary Examiner* — David A Zarneke
(74) *Attorney, Agent, or Firm* — Schwabe, Williamson & Wyatt P.C.

(57) ABSTRACT

Embodiments include semiconductor packages and method of forming the semiconductor packages. A semiconductor package includes a plurality of conductive layers over a package substrate. The conductive layers include a first conductive layer and first-level interconnects (FLIs) in the package substrate. The semiconductor package also includes a solder resist that surrounds the FLIs, where the solder resist has a top surface that is substantially coplanar to top surfaces of the FLIs, a bridge coupled directly to the first conductive layer with solder balls, where the first conductive layer is coupled to the FLIs, and a dielectric over the conductive layers, the bridge, and the solder resist of the package substrate. The bridge may be an embedded multi-die interconnect bridge (EMIB). The first conductive layer may include first conductive pads and second conductive pads. The FLIs may include first conductive vias, second conductive vias, diffusion layers, and third conductive pads.

17 Claims, 12 Drawing Sheets

(51) Int. Cl.
*H01L 21/683* (2006.01)
*H01L 23/00* (2006.01)
*H01L 23/31* (2006.01)

(52) U.S. Cl.
CPC ........ *H01L 21/486* (2013.01); *H01L 21/6835* (2013.01); *H01L 23/3121* (2013.01); *H01L 23/3135* (2013.01); *H01L 23/5383* (2013.01); *H01L 23/5386* (2013.01); *H01L 23/5389* (2013.01); *H01L 24/16* (2013.01); *H01L 24/95* (2013.01); *H01L 2221/68345* (2013.01); *H01L 2221/68359* (2013.01); *H01L 2221/68372* (2013.01); *H01L 2224/16227* (2013.01); *H01L 2224/95001* (2013.01); *H01L 2924/3511* (2013.01)

(58) Field of Classification Search
CPC ...... H01L 23/315; H05K 1/183; H05K 1/185; H05K 1/186
See application file for complete search history.

(56) References Cited

U.S. PATENT DOCUMENTS

| | | | | |
|---|---|---|---|---|
| 9,443,824 | B1* | 9/2016 | We | H01L 25/0655 |
| 9,867,296 | B2* | 1/2018 | Kim | H01L 25/50 |
| 9,997,446 | B2* | 6/2018 | Kim | H01L 21/4857 |
| 10,833,052 | B2* | 11/2020 | Shih | H01L 25/0655 |
| 11,058,006 | B2* | 7/2021 | Yoshino | H05K 3/4644 |
| 11,114,308 | B2* | 9/2021 | Okamoto | H01L 24/32 |
| 11,289,424 | B2* | 3/2022 | Wu | H01L 23/3128 |
| 11,430,740 | B2* | 8/2022 | May | H01L 24/25 |
| 11,488,906 | B2* | 11/2022 | Cho | H01L 23/49838 |
| 2014/0091442 | A1* | 4/2014 | Cheah | H01L 24/19 |
| | | | | 257/E23.033 |
| 2016/0043041 | A1* | 2/2016 | Yang | H01L 21/76885 |
| | | | | 257/669 |
| 2016/0141234 | A1* | 5/2016 | We | H01L 23/5385 |
| | | | | 361/767 |
| 2016/0190079 | A1* | 6/2016 | Liao | H01L 24/81 |
| | | | | 257/737 |
| 2020/0035591 | A1* | 1/2020 | Hu | G01R 3/00 |
| 2020/0144192 | A1* | 5/2020 | Choi | H01L 23/367 |
| 2020/0286814 | A1* | 9/2020 | Mahajan | H01L 21/565 |
| 2021/0125933 | A1* | 4/2021 | Chen | H01L 25/0652 |

* cited by examiner

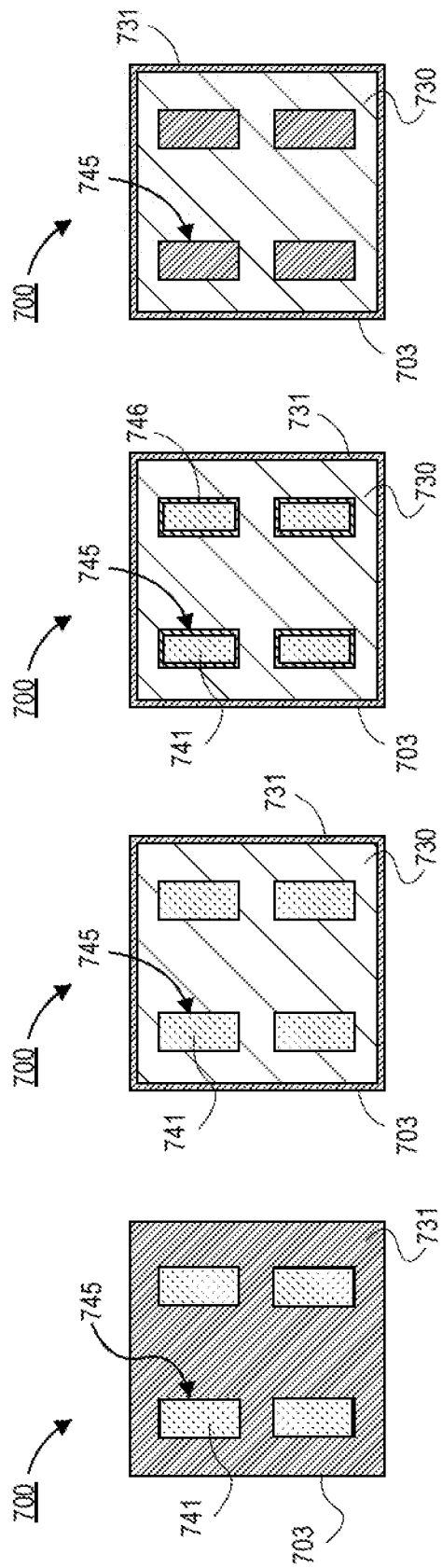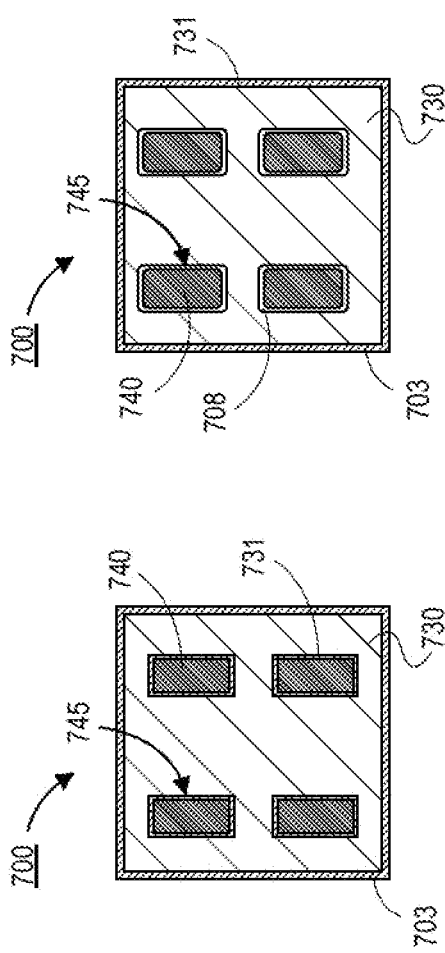

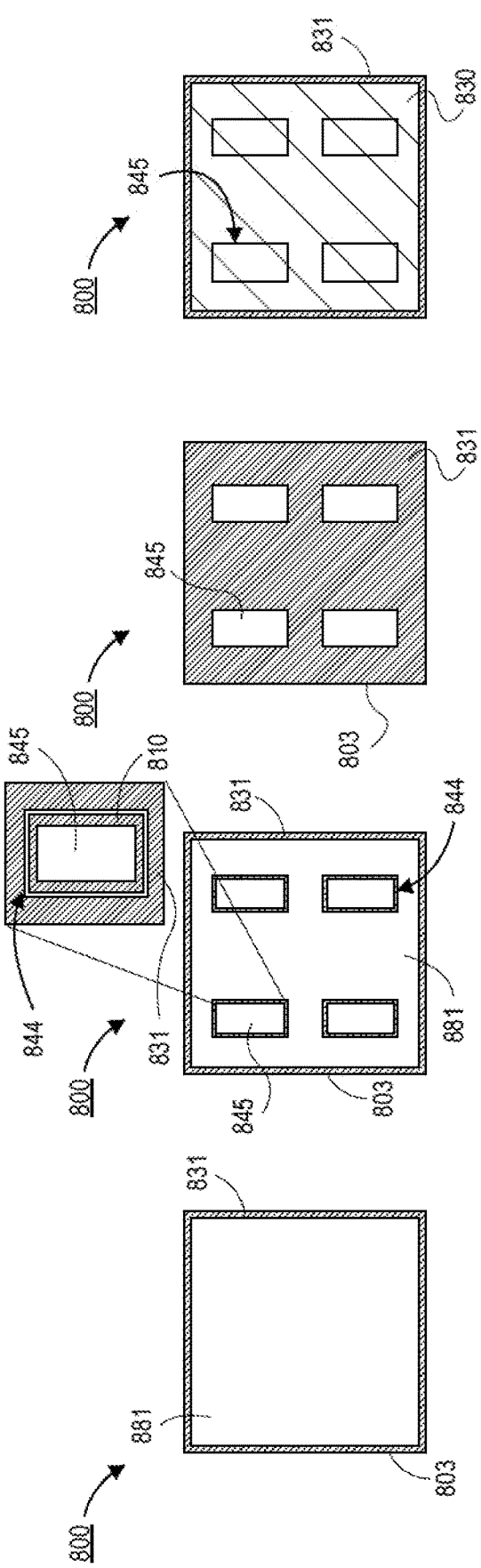
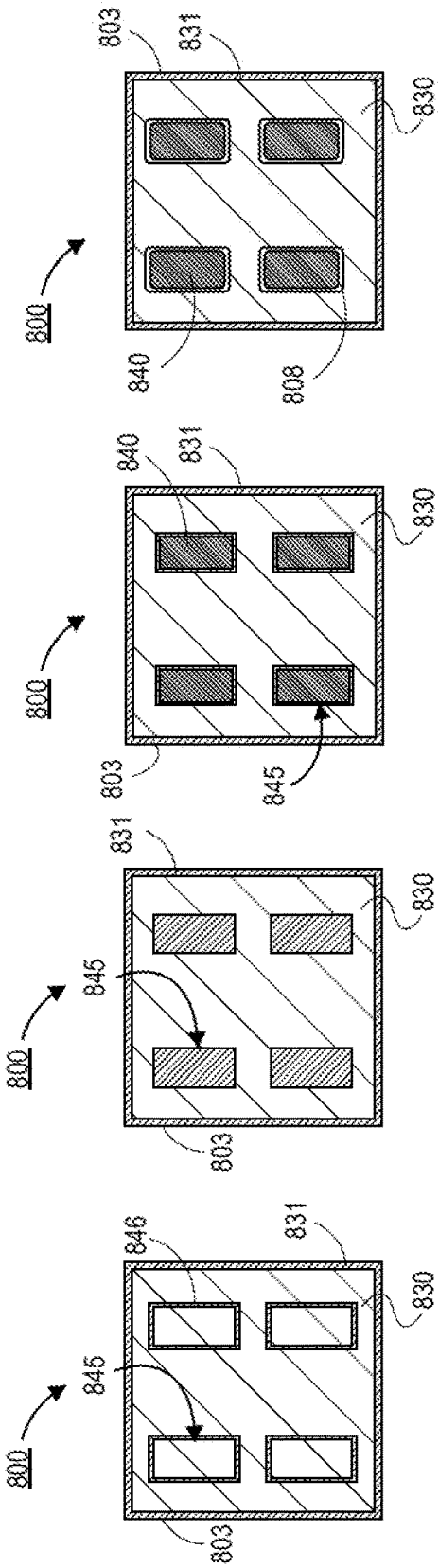
FIG. 8A  FIG. 8B  FIG. 8C  FIG. 8D
FIG. 8E  FIG. 8F  FIG. 8G  FIG. 8H

CORELESS ARCHITECTURE AND PROCESSING STRATEGY FOR EMIB-BASED SUBSTRATES WITH HIGH ACCURACY AND HIGH DENSITY

FIELD

Embodiments relate to packaging semiconductor devices. More particularly, the embodiments relate to semiconductor devices with package substrates with high-accuracy and high-density embedded interconnect bridges.

BACKGROUND

For the past several decades, the scaling of features in integrated circuits has been a driving force behind an ever-growing semiconductor industry. Scaling to smaller and smaller features enables increased densities of functional units on the limited real estate of semiconductor devices. The drive to scale-down these ICs, such as embedded multi-die interconnect bridges (EMIBs), while optimizing the performance of each device, however, is not without issue.

Dies continue to shrink for transistors to minimize power consumption and achieve higher-clocking frequency. Moreover, existing substrate technology is demanding the total number of embedded bridge dies in substrates to continually increase in order to integrate multiple smaller dies. These demands are leading to increasingly tighter pitches in the first layer interconnect (FLI) and the bridge die layer (BDL) of the substrate, and more stringent bump thickness variation (BTV) requirements for the die attachment process. Accordingly, this puts additional pressure on further meeting the increasingly stringent overlay, high-density patterning, and low BTV requirements—while minimizing the manufacturing cost and maximizing the yield—in order to successfully assemble the packages.

Existing solutions cannot meet tighter patterning, overlay, and warpage requirements for next-generation EMIB substrate technology as a result of the following problems. These existing problems include: (i) build-up processes that use indirect alignment for some upper layers, thereby artificially leading to even more stringent overlay requirements than needed; (ii) warpage that negatively impacts overlay accuracy as most critical layers are built last and thus built on already severely warped/stiff panels, thereby leading to worse overlay performance; (iii) tighter pitches as patterning with high yield across the panel becomes very challenging, thereby the total thickness variation (TTV) and flatness of the upper layers cannot meet the requirement to achieve high density patterning of critical layers; (iv) increased bump thickness variation (BTV) as solder resist (SR) and FLI are typically formed on top of several build-up layers of plated metal and dielectrics, thereby leading to increased metal density differences among regions with different bump pitches, and increased severe via recesses in the upper layers making it even more challenging to achieve uniform bump height of the plated copper or tin; (v) higher residual warpage that makes the patterning overlay worse, thereby leading to unexpected out-of-specification failures; and (vi) warpage that caused out-of-focus patterning as slight out-of-focus patterning of fine features (e.g., fiducials) repeatedly occurred, thereby negatively impacting the downstream overlay performance.

BRIEF DESCRIPTION OF THE DRAWINGS

Embodiments described herein illustrated by way of example and not limitation in the figures of the accompanying drawings, in which like references indicate similar features. Furthermore, some conventional details have been omitted so as not to obscure from the inventive concepts described herein.

FIGS. 7A-7F are illustrations of plan views of a process flow using a patterned panel with patterned laser stoppers, which can be removed with etching to form a plurality of cavities that include a plurality of EMIBs, according to some embodiments.

FIGS. 8A-8H are illustrations of plan views of a process flow using a patterned panel with metallic rings as laser stoppers, which are embedded in a metal layer patterning, to form a plurality of cavities that include a plurality of EMIBs, according to some embodiments.

DETAILED DESCRIPTION

Figure 1A:
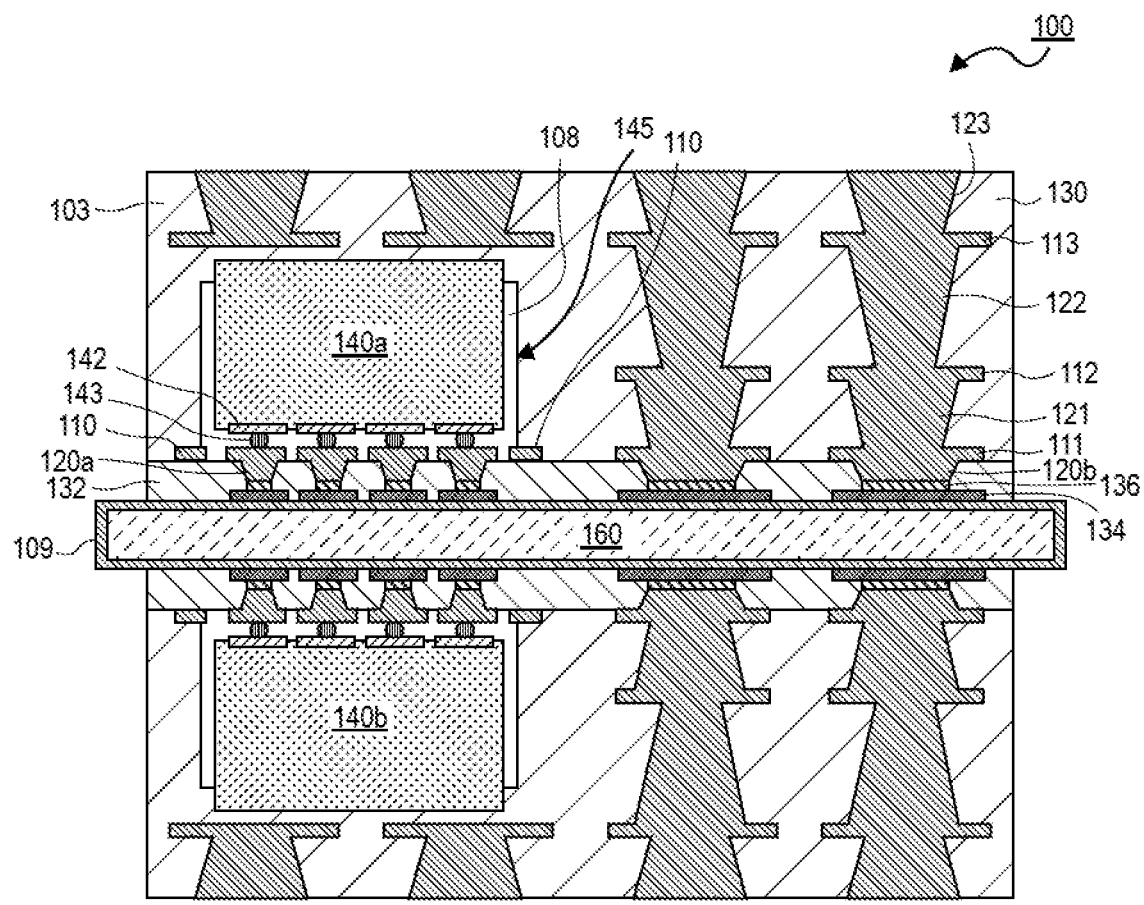
FIGS. 1A-1C are illustrations of cross-sectional views of a process flow to form a plurality of semiconductor packages, where each package includes a package substrate, an embedded multi-die interconnect bridge (EMIB), and first level interconnects (FLIs) that are initially disposed to provide flat bump surfaces and solder bumps with low bump thickness variation (BTV), and where the FLIs have the highest stringent overlay and high-density requirements, according to some embodiments.

Described herein are semiconductor packages with package substrates with high-accuracy and high-density embedded interconnect bridges and methods of forming such semiconductor packages. The semiconductor packages described below and methods of forming such semiconductor packages include a package substrate with an embedded multi-die interconnect bridge (EMIB), a plurality of conductive layers, and a plurality of etch stop layers (or etch stoppers), where the conductive layers include a plurality of first level interconnects (FLIs) that have stringent overlay and high-density requirements, according to some embodiments. In these embodiments, the semiconductor package described herein initially patterns and disposes the FLIs directly on a rigid and flat carrier to provide solder bumps with flat surfaces and low bump thickness variation (BTV) in order to overcome the problems involved with higher/stringent overlay, warpage, and density requirements.

As noted above increased stringent overlay, residual warpage, overlay inaccuracy, BTV, and tighter pitches are major problems for next-generation EMIB technologies. Particularly, these problems have led to (i) the purchase of patterning tools with higher resolution and accuracy to meet indirect alignment requirements, and (ii) the replacement of organic cores with glass cores to mitigate the warpage problems. However, these two existing technologies have led to further disadvantages and/or problems.

The main disadvantages of purchasing these new tools noted above include increased cost, which is not a cost-effective way to meet the artificially stringent overlay requirement that is set by the indirect alignment following the typical build-up process. Additionally, another disadvantage includes when the tool accuracy is approaching sub-micron, where purchasing new tools can no longer be a technically viable solution. One other disadvantage of purchasing tools is that warpage-caused overlay errors and fiducial reading errors become dominant factors for heightened overlay errors.

The main disadvantages of glass core panels includes increased cost as the cost of glass cores are a major drawback. For example, to minimize warpage, glass cores typically focus on thickness, as thicker glass cores can provide higher stiffness, thereby substantially increasing costs with thicker glass cores. Another disadvantage is that the fragile nature of glass cores can cause breakage/chipping, thereby leading to non-quality related scraps. Additionally, one other disadvantage is that, as the number of build-up layers increase, the initial advantage of glass cores having slightly higher Young's modulus compared to organic cores can quickly diminish. Another major disadvantage of implementing glass cores is having to use a combination of specialized tools and processes that is needed for glass core-based substrate manufacturing, which can thereby lead to factory-wide tool upgrades and specialized processes such as de-bonding, cleaning, glass cutting, panel identification creation, etc. Lastly, an additional disadvantage is that using glass cores does not typically solve the warpage problem, as thick glass cores cannot be typically used as part of the substrate, accordingly once the glass cores are removed, the residual stress within the build-up layers can cause the substrate to warp and further complicate the assembly.

Accordingly, embodiments described herein include disposing (or building/forming) the critical build-up layers first, taking advantage of the improved panel flatness (i.e., leading to substantially no warpage) used to assemble each package, in order to overcome these disadvantages. Using such embodiments provides these advantages, minimizing warpage-caused fiducial reading error and patterning error even when involved with high-density packages, higher stack numbers, and more embedded multi-die packages. Additionally, implementing these embodiments described above improve packaging solutions by (i) enabling direct alignments at critical layers, which effectively increases the overlay yield while minimizing the tool accuracy requirement, and improves bridge die-to-via overlay as the overlay requirement becomes tighter and the total needed bridge dies increase; (ii) providing BTV that may be substantially equal to (and thus as good as) the flatness of the substrate (e.g., organic cores or other carriers such as glass, stainless steel, etc.); (iii) facilitating minimum warpage, which remarkably improves control of the laser drilling focus and the litho-patterning focus, and eliminates chances of out-of-focus drilling and pattern distortion, including creation of fiducials that are used for the downstream overlay; (iv) enabling symmetric process design which minimizes the panel warpage; and (v) providing a package substrate implemented with a coreless (or core-less) construction, which reduces the substrate thickness and is highly favored for mobile solutions.

The technologies described herein may be implemented in one or more electronic devices. Non-limiting examples of electronic devices that may utilize the technologies described herein include any kind of mobile device and/or stationary device, such as microelectromechanical systems (MEMS) based electrical systems, gyroscopes, advanced driving assistance systems (ADAS), 5G communication systems, cameras, cell phones, computer terminals, desktop computers, electronic readers, facsimile machines, kiosks, netbook computers, notebook computers, interne devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. Such devices may be portable or stationary. In some embodiments, the technologies described herein may be employed in a desktop computer, laptop computer, smart phone, tablet computer, netbook computer, notebook computer, personal digital assistant, server, combinations thereof, and the like. More generally, the technologies described herein may be employed in any of a variety of electronic devices, including semiconductor packages having package substrates with EMIBs, conductive layers, etch stop layers, and FLIs, where the FLIs and/or through silicon vias (TSVs) may provide power to the EMIBs.

In the following description, various aspects of the illustrative implementations will be described using terms commonly employed by those skilled in the art to convey the substance of their work to others skilled in the art. However, it will be apparent to those skilled in the art that the present embodiments may be practiced with only some of the described aspects. For purposes of explanation, specific numbers, materials and configurations are set forth in order to provide a thorough understanding of the illustrative implementations. However, it will be apparent to one skilled in the art that the present embodiments may be practiced without the specific details. In other instances, well-known features are omitted or simplified in order not to obscure the illustrative implementations.

Various operations will be described as multiple discrete operations, in turn, in a manner that is most helpful in understanding the present embodiments, however, the order of description should not be construed to imply that these operations are necessarily order dependent. In particular, these operations need not be performed in the order of presentation.

As used herein the terms "top," "bottom," "upper," "lower," "lowermost," and "uppermost" when used in relationship to one or more elements are intended to convey a relative rather than absolute physical configuration. Thus, an element described as an "uppermost element" or a "top element" in a device may instead form the "lowermost element" or "bottom element" in the device when the device is inverted. Similarly, an element described as the "lowermost element" or "bottom element" in the device may instead form the "uppermost element" or "top element" in the device when the device is inverted.

Figure 1B:
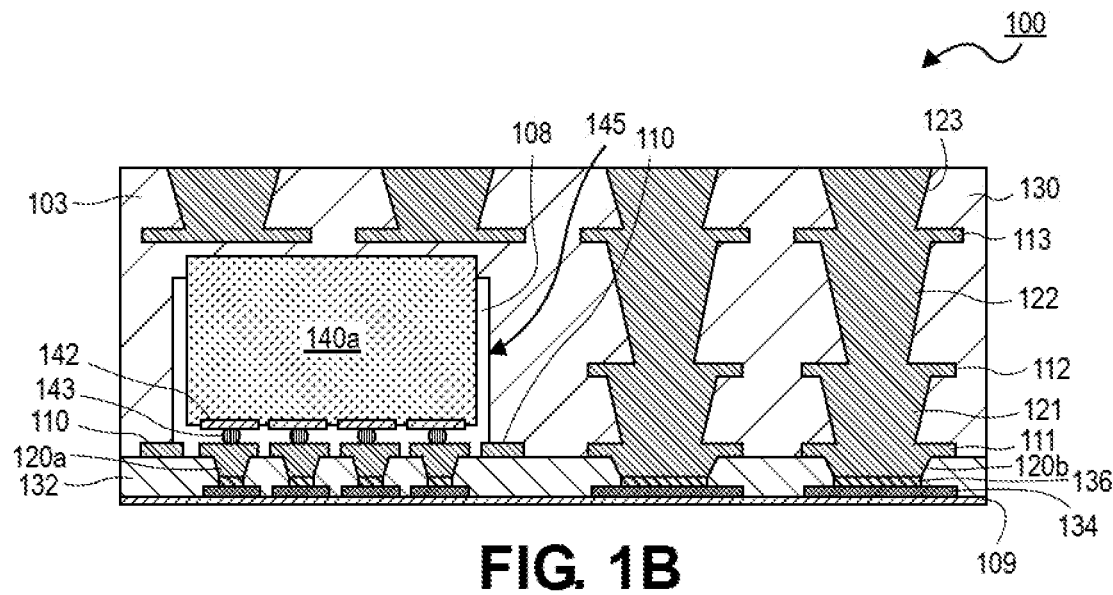
Figure 1C:
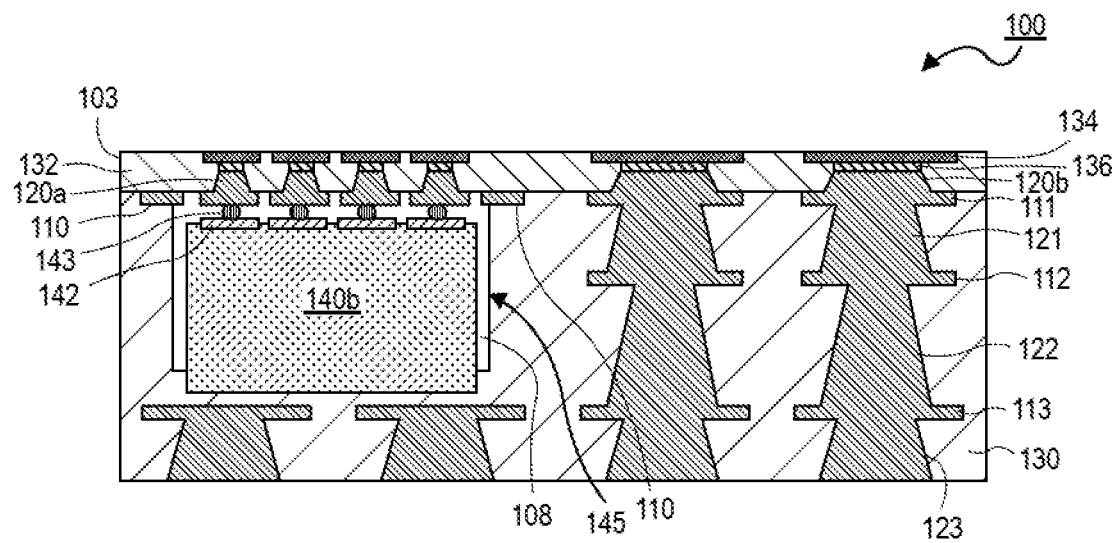

FIGS. 1A-1C are a series of perspective illustrations that depict a semiconductor package 100 implementing architectures and process flows for different hetero-structure packaging applications, in accordance with an embodiment. Furthermore, FIGS. 1A-1C illustrate one of the approaches that enables a key new aspect of the process flow to pattern and dispose the critical layer (i.e., such layer that includes the solder resist (SR) 132 and FLIs 134 as shown in FIG. 1A) first on a smooth/flat carrier (e.g., as shown with the carrier 160 (or the peelable/releasable core/substrate) of FIG. 1A). The illustrated process flow described below may dispose the bridge dies (and/or logic dies) through a thermal compression bonding (TCB) process, and directly align the bridge dies to the critical layer(s) that are initially patterned on the smooth carrier, according to some embodiments. Additionally, such embodiments provide solder bumps that connect the dies on both sides with only two conformal plating layers away from the smooth/flat surface, thereby maintaining a low BTV during the die-attach process.

Additionally, note that the semiconductor packages described herein may include a symmetric process design to minimize the panel warpage (i.e., as illustrated in FIGS. 1A-1C, the semiconductor package 100 may be implemented to form two symmetrical packages). As such, even if each of the components and processes described herein refer to a single component/process, such component/process may actually be implemented simultaneously in the symmetrical semiconductor package, according to some embodiments.

Referring now to FIG. 1A, a cross-sectional illustration of a semiconductor package 100 is shown, in accordance with an embodiment. In one embodiment, the semiconductor package 100 may include a carrier 160. The carrier 160 may be a peelable core, such as an organic core, any other carrier comprised of glass, stainless steel, etc., or the like. The peelable core 160 may be surrounded by a seed copper layer 109 (or a seed layer). In one embodiment, the seed layer 109 may be copper, titanium, or the like. In an embodiment, the seed layer 109 may be formed with a sputtering process or the like. The peelable core 160 may provide a flat, rigid, and smooth surface that is used to initially pattern and form a package substrate 103.

In one embodiment, the package substrate 103 may have a critical layer that includes a SR layer 132 and a plurality of FLIs 134 (or first level conductive interconnects formed of copper, tin or the like). As shown in FIG. 1A and described herein, the FLIs may be comprised of an initial (or first) conductive layer 134 (e.g., the conductive layer 134 may include a plurality of conductive bumps, such as tin bumps, copper bumps, or the like), a diffusion layer/barrier 136 (e.g., the diffusion layer/barrier 136 may include one or more conductive materials, such as palladium, tin, indium, tungsten, cobalt, nickel, phosphorus, nickel, or the like), and a plurality of vias patterned (or formed/disposed) over/on the diffusion layer 136 and the conductive layer 134, respectively. In one embodiment, the FLIs 134 may be coupled directly onto the peelable core 160 with the diffusion layer 136.

For one embodiment, the package substrate 103 may include, but is not limited to, a package, a substrate, a printed circuit board (PCB), and a motherboard. For one embodiment, the package substrate 103 is a PCB. For one embodiment, the PCB is made of an FR-4 glass epoxy base with thin copper foil laminated on both sides. For certain embodiments, a multilayer PCB can be used, with pre-preg and copper foil used to make additional layers. For example, the multilayer PCB may include one or more dielectric layers 130, where each dielectric layer can be a photosensitive dielectric layer. For some embodiments, holes may be drilled in the PCB 103. For one embodiment, the PCB 103 also includes a plurality of conductive layers 111-113 (i.e., a first, second, and third conductive/metallic layers 111-113) and vias 120a-b and 121-123 comprised of copper or metallic traces, lines, pads (e.g., C4 pads), vias, via pads, and/or planes, holes.

As shown in FIG. 1A, a first conductive layer 111 may be disposed over the FLIs 134. In one embodiment, the first conductive layer 111 may have a plurality of first pads coupled to the conductive vias 120a, and a plurality of second pads coupled to the conductive vias 120b, where the conductive vias 120b are directly coupled to the conductive layers 111-113 and vias 121-123. In these embodiments, the first pads of the first conductive layer 111 may have a thickness that is substantially equal to a thickness of the second pads of the first conductive layer 111. Accordingly, the first pads of first conductive layer 111 may have top surfaces that are substantially coplanar to top surfaces of the second pads of the first conductive layer 111, as a result of patterning and disposing the conductive vias 120a-b, the diffusion barrier 136, and the FLIs 134 directly over the flat surface(s) of the peelable core 160. In one embodiment, the first pads of the first conductive layer 111 may have a width that is less than a width of the second pads of the first conductive layer 111. Respectively, the conductive vias 120a may have a width that is less than a width of the conductive vias 120b, according to an embodiment.

In some embodiments, a plurality of bridge dies 140a-b may be disposed directly over the first conductive layer 111 and the conductive vias 120a. The bridge dies 140a-b may have conductive pads 142 that are coupled to the first conductive layer 111 by a plurality of solder balls 143. In an embodiment, the bridge dies 140a-b may be a silicon bridge or a bridge made of any other substrate material that is suitable for forming bridges. In one embodiment, the bridge dies 140a-b may be an EMIB. In an embodiment, the bridge dies 140a-b may have a plurality of interconnects such as TSVs. For some embodiments, the TSVs may provide power to the EMIBs 140a-b and may electrically couple one or more of the conductive layers 111-113 to the conductive pads 142 of the EMIBs 140a-b and other components and/or circuitry in the semiconductor package 100.

In an embodiment, the bridge dies 140a-b may be embedded in the package substrate 103. In one embodiment, the dielectric layer 130 may embed (or surround) one or more surfaces of the EMIBs 140a-b. For example, the top surface (or the die face) of the EMIB 140a may be surrounded by the dielectric layer 130, as such the dielectric layer 130 may be disposed between the die face of the EMIBs 140a-b and the pads of the conductive layer 113 that are over the die face of the EMIBs 140a-b. Additionally, in some embodiments, the EMIBs 140a-b may be disposed in a cavity 145 and surrounded by an encapsulation layer 108. In one embodiment, the encapsulation layer 108 may be an epoxy underfill. For one embodiment, the encapsulation layer 108 may include an epoxy (e.g., a soft epoxy, a stiff epoxy, opaque epoxy, etc.) with one or more filler materials. In an embodiment, the encapsulation layer 108 may be a mold layer or any such similar encapsulation material(s). In an embodiment, the mold layer 108 may be compression molded, laminated, or the like.

In some embodiments, the first conductive layer 111 may also include a plurality of etch stop layers 110 (or etch stoppers). In one embodiment, the etch stoppers 110 may be disposed on the edges (or outer walls) of the cavity 145 and adjacent to the pads of the first conductive layer 111 that are positioned below the EMIB 140a-b. In one embodiment, the etch stoppers 110 may have a thickness that is approximately equal to a thickness of the first conductive layer 111. In an embodiment, the etch stoppers 110 may be formed of copper and/or ultra-violet (UV)-laser stopper materials, such as zinc oxide (ZnO), ferric oxide ($Fe_2O_3$), copper oxide ($CuO_x$), or the like. The etch stoppers 110 enable (or help) the cavity formation of a patterned panel (e.g., as shown with the etch stoppers and cavity formations of FIGS. 7A-7F and 8A-8H). The etch stoppers 110 may remain in the semiconductor package 100, or may be removed after/post the cavity formation, for example, by a chemical dissolution process or the like.

In some embodiments, the etch stoppers 110 may be as-plated Cu rings (or Cu layers) used as laser stoppers during the cavity formation of the patterned panel (e.g., as shown in FIGS. 8A-8H). In some embodiments, implementing the etch stoppers 110 as an as-plated Cu ring includes delivering (or providing) power to the EMIB 140a with a different Cu layer than the as-plated Cu ring layer, including TSVs in the EMIB and/or Cu layers in the FLIs. In some embodiments, the etch stoppers 110 may be ZnO patterned layers used as laser stoppers during the cavity formation of the patterned panel (e.g., as shown in FIGS. 7A-7F). In these embodiments, the etch stoppers 110 are formed by patterning and sputtering ZnO to form the ZnO patterned layers, where the ZnO patterned layers may be etched away with a mild-acidic buffer after the formation of the cavities in the patterned panel.

Referring now to FIG. 1B, a cross-sectional illustration of a semiconductor package 100 is shown after separation, in accordance with an embodiment. In one embodiment, the peelable core may be separated from the package substrate 103. As such, after the separation, the conductive layer 134 of the package substrate 103 may remain coupled to the seed copper layer 109 (or the seed layer), according to some embodiments.

Referring now to FIG. 1C, a cross-sectional illustration of a semiconductor package 100 is shown after being flipped, and after the seed layer is removed, in accordance with an embodiment. In one embodiment, the seed layer may be removed with an etching process (e.g., a flash etch) or the like. As such, after removing the seed layer, the conductive layer 134 may have surfaces that are exposed, where the exposed surfaces may be used to couple the package substrate 103 to additional components (e.g., dies, substrates, active/passive devices, etc.). In one embodiment, the exposed surfaces of the conductive layer 134 may be substantially coplanar to a surface of the solder resist 132.

Accordingly, in the embodiments described herein, the semiconductor package 100 (and/or any semiconductor package described below) includes (i) the package substrate 103 that may be referred to as a coreless EMIB-based package substrate (or a coreless EMIB-based substrate), (ii) the conductive vias 120a-b and 121-123 that may have via shapes that are inversed, such as inversed, tapered sidewalls (e.g., as compared to tapered sidewalls of existing conductive vias), (iii) the conductive bumps/pads 134 (or the FLI bumps, the solder bumps, etc.) that may have flat surfaces, substantially equal solder volume, and low BTV (e.g., as compared to inaccurate control of conductive/solder volume of existing solder bumps), and (iv) the EMIB 140a (and/or EMIB 140b) that may have a die face that faces down and away from the critical layers of SR 132 and first conductive layer 111.

In some embodiments, the process flows described herein may implement a semiconductor package, such as the semiconductor package 100, having a package substrate with a plurality of build-up layers. Such process flows may start with the critical layers of the build-up layers (e.g., the layers comprising the SR 132 and the first conductive layer 111), which require the most stringent overlay, and high-density patterning capability. To overcome these requirements, the process flow may thus dispose the critical layer(s) directly on the rigid and flat carrier (e.g., the carrier 160), and then dispose an EMIB with solder balls (e.g., the EMIBs 140a-b with the solder balls 143) directly on the critical layer, which automatically enables the conductive bumps/layer of the FLIs 134 to have flat bump surfaces and accurately controlled solder volume, and respectively enables the solder balls to have a substantially low BTV. As such, the process flow may only need two steps with stringent overlays, including the lithography patterning of the first conductive layer 111 and the patterning of the FLI SR 132 (e.g., as compared to a traditional process flow that typically requires five steps with critical overlays, including the EMIB die placement overlay, SR overlay, the FLIs overlay, and the overlays of the conductive layer and vias directly above the EMIB (or bridge die layer overlays). Moreover, the process flow described herein may comfortably implement these two critical overlay requirements of the SR and first conductive layers with lithography processing based on the direct alignment.

This allows the process flow to avoid indirect overlay, which artificially requires a more stringent overlay as compared to the overlay that is actually needed. Additionally, as shown in FIG. 1A, the process flow may use a symmetrical build-up process (i.e., a symmetrical process flow) to minimize warpage and reduce manufacturing costs (e.g., using an organic carrier, such as the peelable core 160, with a low thickness may substantially reduce the manufacturing costs). The process flow may, however, use a thicker organic substrate if needed, since the thicker organic substrate is still acting as the carrier, and thus may not affect the overall z-height of the final product (or the final semiconductor package).

Note that the semiconductor package 100 may include fewer or additional packaging components based on the desired packaging design.

Figure 2:
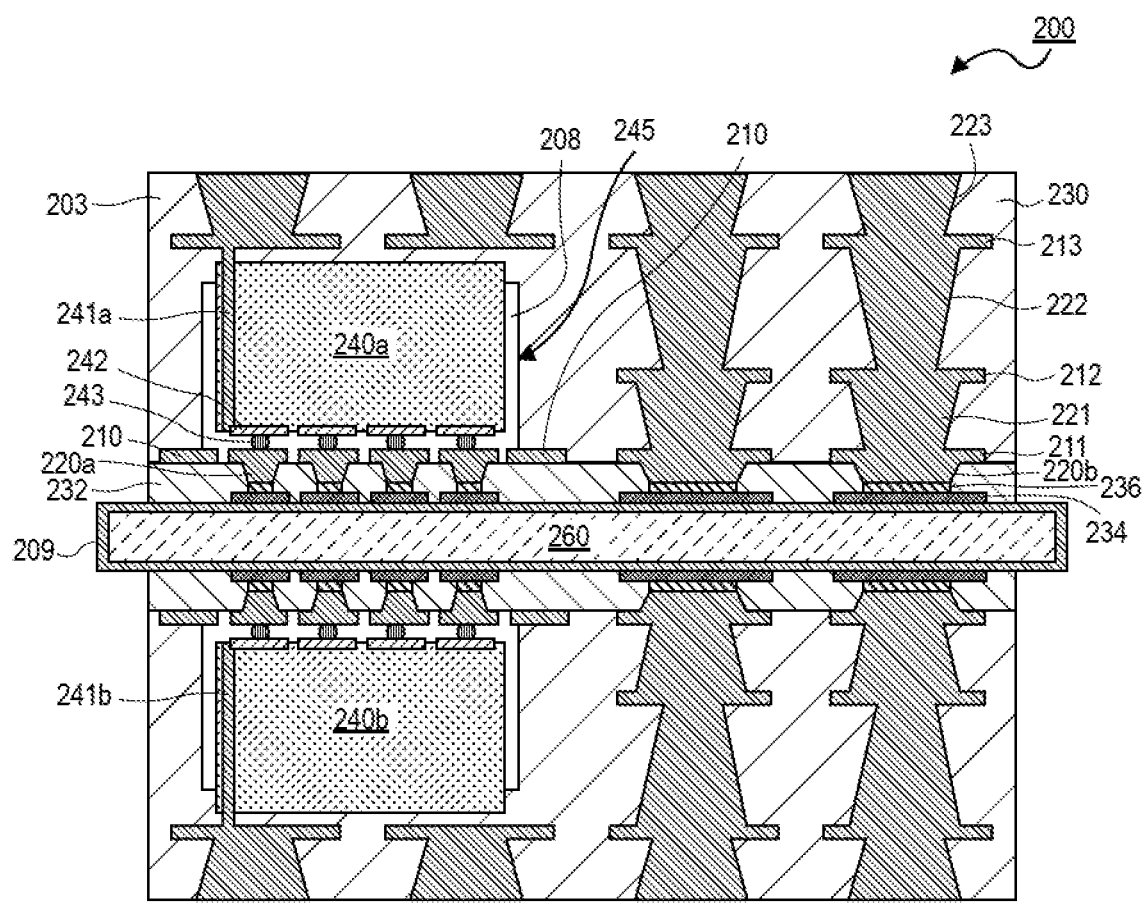
FIG. 2 is an illustration of a cross-sectional view of a plurality of semiconductor packages with package substrates, EMIBs, and conductive layers, where through silicon vias (TSVs) provide power to the EMIBs, according to one embodiment.

Referring now to FIG. 2, a cross-sectional illustration of a semiconductor package 200 is shown, in accordance with an embodiment. The semiconductor package 200 may be substantially similar to the semiconductor package 100 described above in FIGS. 1A-1C, with the exception that TSVs 241a-b extend through the EMIBs 240a-b from the conductive layer 213 to the conductive pads 242 of the EMIBs 240a-b, according to some embodiments. In one embodiment, the TSVs 241a-b may be conductive (or copper) interconnects formed with a lithography process or the like.

In one embodiment, the TSVs 241a-b may be implemented to deliver power to the EMIBs 240a-b, as the conductive layer 213 and the conductive pads 242 of the EMIBs 240a-b are conductively coupled. For example, the TSVs 241a-b may be implemented with the EMIBs 240a-b when the package substrate 203 includes the etch stoppers 210 as as-plated copper rings. For some embodiments, the TSVs 241a-b may provide power to the EMIBs 240a-b and may electrically couple one or more of the conductive layers 211-213 to the conductive pads 242 of the EMIBs 240a-b and other components and/or circuitry in the semiconductor package 200. While one TSV 241a is shown to be disposed in the EMIB 240a, any number of TSVs 241a may be implemented with the EMIB 240a based on the desired packaging design/application, according to one embodiment.

Note that the semiconductor package 200 may include fewer or additional packaging components based on the desired packaging design.

Figure 3:
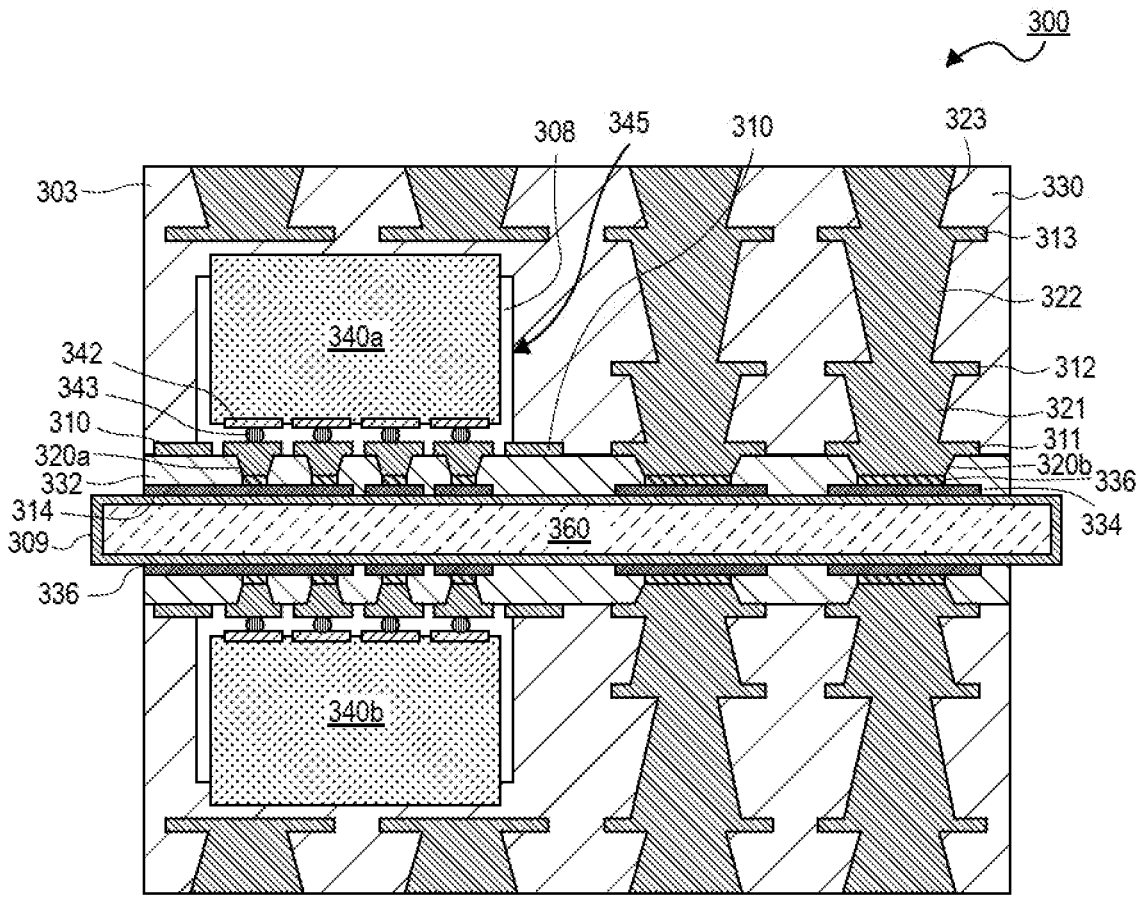
FIG. 3 is an illustration of a cross-sectional view of a plurality of semiconductor packages with package substrates, EMIBs, and conductive layers, where FLIs provide power to the EMIBs, according to one embodiment.

Referring now to FIG. 3, a cross-sectional illustration of a semiconductor package 300 is shown, in accordance with an embodiment. The semiconductor package 300 may be substantially similar to the semiconductor package 100 described above in FIGS. 1A-1C, with the exception that conductive layers 314 are disposed and coupled with the first conductive layer 311 and the conductive vias 320a, according to some embodiments. In one embodiment, the conductive layer 314 may be a conductive (or copper) plane/trace formed with a lithography process or the like.

In one embodiment, the conductive layers 314 may be implemented to deliver power to the EMIBs 340a-b, as the conductive layers 314 are electrically coupled to the conductive vias 320a and the first conductive layer 311. For example, the conductive layers 314 may be implemented with the EMIBs 340a-b when the package substrate 303 includes the etch stoppers 310 as as-plated copper rings. For some embodiments, the conductive layers 314 may provide power to the EMIBs 340a-b and may electrically couple one or more of the conductive vias 320a to other components and/or circuitry in the semiconductor package 300. While one conductive layer 314 is shown to be disposed under two conductive vias 320a, any number of conductive vias 320a may be coupled to the conductive layer 314, as the conductive layer 314 may be further extended through the first conductive layer 311, based on the desired packaging design/application, according to one embodiment.

Note that the semiconductor package 300 may include fewer or additional packaging components based on the desired packaging design.

Figure 4:
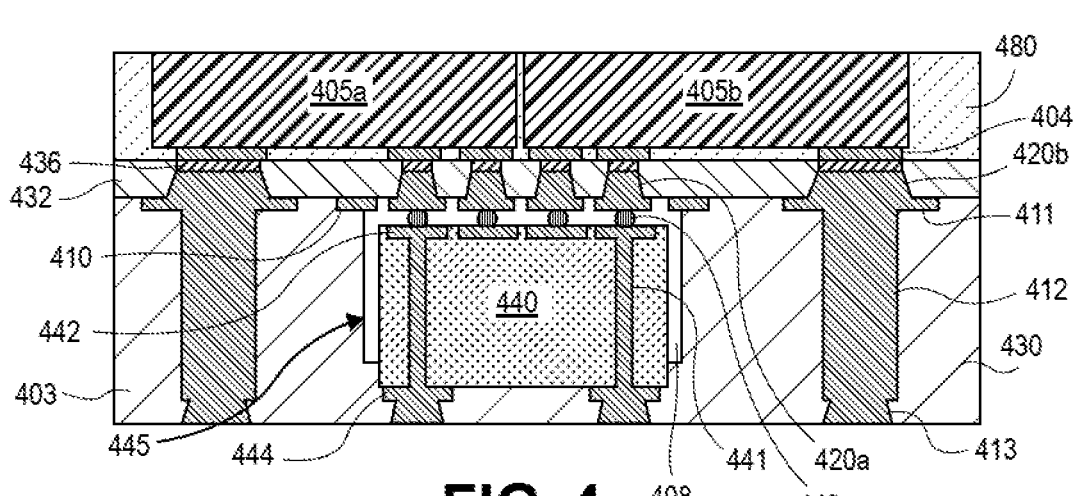
FIG. 4 is an illustration of a cross-sectional view of a semiconductor package with a package substrate, an EMIB, and a plurality of active functional dies powered by a plurality of conductive pillars, where a plurality of TSVs provide power to the EMIB, according to one embodiment.

Referring now to FIG. 4, a cross-sectional illustration of a semiconductor package 400 is shown, in accordance with an embodiment. The semiconductor package 400 may be substantially similar to the semiconductor packages 100 and 200 described above in FIGS. 1A-1C and 2, with the exception that a plurality of conductive pillars 412 are disposed in the dielectric layer 430 and extend vertically from the first conductive layer 411 to the conductive vias 413, as a plurality of active functional dies 440 are powered by the conductive pillars 412, according to some embodiments. In one embodiment, the conductive pillars 412 may be a plurality of conductive (or copper) vertical interconnects formed with a lithography process or the like.

In one embodiment, the conductive pillars 412 are coupled to the conductive vias 420b. In one embodiment, the conductive pillars 412 are disposed in the package substrate 403 to route electrical signals between the conductive vias 413 to the plurality of dies 405a-b (or active functional dies). In an embodiment, the dies 405a-b may be a microelectronic device, a semiconductor die, an integrated circuit (IC), a central processing unit (CPU), a microprocessor, a platform controller hub (PCH), a memory, and/or a field-programmable gate array (FPGA). Additionally, as shown in FIG. 4, an encapsulation layer 480 may be disposed over the dies 405a-b and the solder resist 432, according to one embodiment. In one embodiment, the encapsulation layer 480 may surround the dies 405a-b and a plurality of conductive bumps 404 that couple the dies 405a-b to the FLIs 436, the conductive vias 420a-b, and the first conductive layer 411.

In one embodiment, the encapsulation layer 480 may be a mold layer and/or any similar encapsulation material(s). For one embodiment, the encapsulation layer 480 may include an epoxy (e.g., a soft epoxy, a stiff epoxy, opaque epoxy, etc.) with one or more filler materials. In an embodiment, the encapsulation layer 480 may be compression molded, laminated, or the like. In an embodiment, the encapsulation layer 480 may be disposed over the top surfaces of the dies 405a-b, and subsequently planarized to have a top surface that is substantially coplanar to the top surface of the dies 405a-b.

In one embodiment, the FLI 436 (or the FLI diffusion layer) may have a plurality of surfaces that are substantially coplanar to a surface of the solder resist 432. In some embodiments, the dies 405a-b are coupled to the diffusion layer 436 and the conductive vias 420a-b with the conductive bumps 404. In one embodiment, the dies 405a-b are disposed over the EMIB 440, where the EMIB 440 may electrically couple the die 405a to the die 406b.

In one embodiment, the TSVs 441 may be implemented to deliver power to the EMIB 440, as the conductive layer 444 are conductively coupled to the conductive pads 442 of the EMIB 440. For example, the TSV 441 may be implemented with the EMIB 440 when the package substrate 403 includes the etch stoppers 410 as as-plated copper rings. For some embodiments, the TSV 441 may provide power to the EMIB 440 and may electrically couple the conductive layer 444 to the conductive pads 442 of the EMIB 440 and other components and/or circuitry in the semiconductor package 400.

Accordingly, the semiconductor package 400 enables improved on-die pillar architectures by implementing direct alignment, improved patterning capabilities, and reduced total thickness variation (TTV) and BTV. Additionally, the process flow implemented to form the semiconductor package 400 may reduce two planarization processes to one planarization.

Note that the semiconductor package 400 may include fewer or additional packaging components based on the desired packaging design.

FIGS. 5A-5E are a series of cross-sectional illustrations that depict a semiconductor package 500 with a package substrate 503, an EMIB 540, and FLIs 511 that are directly patterned and disposed on a carrier 560 first to provide FLIs 534 with flat bump surfaces and conductive bumps/pads with low BTV, according to some embodiments. The process flow illustrated in FIGS. 5A-5E forms the semiconductor package 500 which is substantially similar to the semiconductor packages 100, 200, and 300 described above in FIG. 1A-1C and 2-3. Accordingly, as described above, the process flow of semiconductor package 500 illustrates one of the approaches that implements building the critical layer(s) first on the rigid and flat carrier to automatically enable the conductive/solder balls to have a flat bump surface and an accurate controlled solder volume, avoiding indirect overlay, using a symmetrical build-up process, and using organic material for the carrier, according to some embodiments.

Figure 5A:
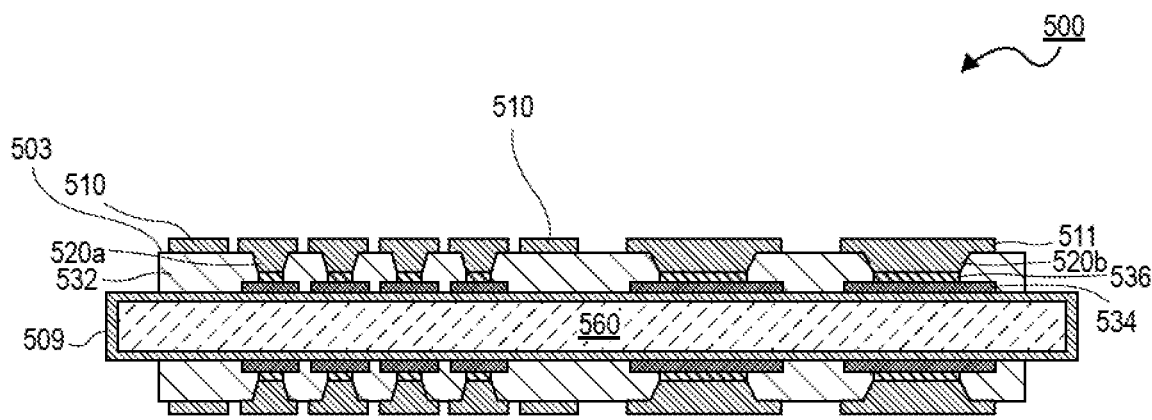
FIGS. 5A-5E are illustrations of cross-sectional views of a process flow to form a plurality of semiconductor packages with package substrates, EMIBs, and conductive layers, where TSVs provide power to the EMIBs, according to some embodiments.

Referring now to FIG. 5A, a cross-sectional illustration of a semiconductor package 500 with a symmetrical build-up of the FLIs 534 is shown, in accordance with an embodiment. In an embodiment, the semiconductor package 500 may include a package substrate 503. The package substrate 503 may be substantially similar to the package substrate 103 described above in FIG. 1A. In one embodiment, the package substrate 503 may be disposed on a carrier 560 (or a peelable core) that is surrounded with a seed layer 509. The package substrate 503 may include the first conductive layer 511 disposed in a resist layer 532, where the first conductive layer 511 also include a plurality of etch stoppers 510 (or copper etch stoppers). In one embodiment, the first conductive layer 511 may be coupled to a plurality of conductive vias 520a-b. In some embodiments, the first conductive layer 511 may be coupled directly onto the peelable core 560 with the conductive vias 520a-b, a diffusion barrier 536 (or a diffusion layer), and a plurality of FLIs 534 (e.g., a plurality of tin bumps). Note that each of the components illustrated in FIG. 5A may be substantially similar to the respective illustrated and described components of FIG. 1A.

Figure 5B:
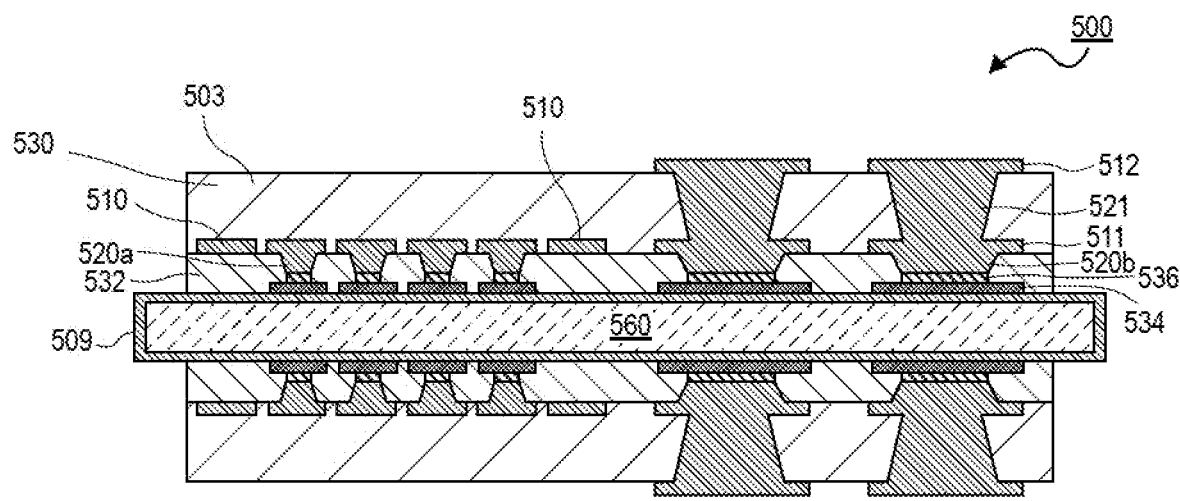

As shown in FIG. 5A, the first conductive layer 511 may have a plurality of first pads coupled to the conductive vias 520a, and a plurality of second pads coupled to the conductive vias 520b, where the conductive vias 520b are directly coupled to the conductive layers 511-512 and vias 521 as shown in FIG. 5B. In these embodiments, the first pads of the first conductive layer 511 may have a thickness that is substantially equal to a thickness of the second pads of the first conductive layer 511. Accordingly, the first pads of the first conductive layer 511 may have top surfaces that are substantially coplanar to top surfaces of the second pads of the first conductive layer 511, as a result of patterning and disposing the conductive vias 520a-b, the diffusion barrier 536, and the FLIs 535 directly over the flat surface(s) of the peelable core 560. In one embodiment, the first pads of the first conductive layer 511 may have a width that is less than a width of the second pads of the first conductive layer 511. Respectively, the conductive vias 520a may have a width that is less than a width of the conductive vias 520b, according to an embodiment.

Referring now to FIG. 5B, a cross-sectional illustration of a semiconductor package 500 with a dielectric and via build-up formation is shown, in accordance with an embodiment. In an embodiment, a dielectric layer 530 may be disposed over the first conductive layer 511 and the solder resist 532. In one embodiment, a plurality of conductive vias 521 may be disposed in the dielectric layer 530 to couple the conductive vias 520b and the respective first conductive layer 511 to a conductive layer 512.

Figure 5C:
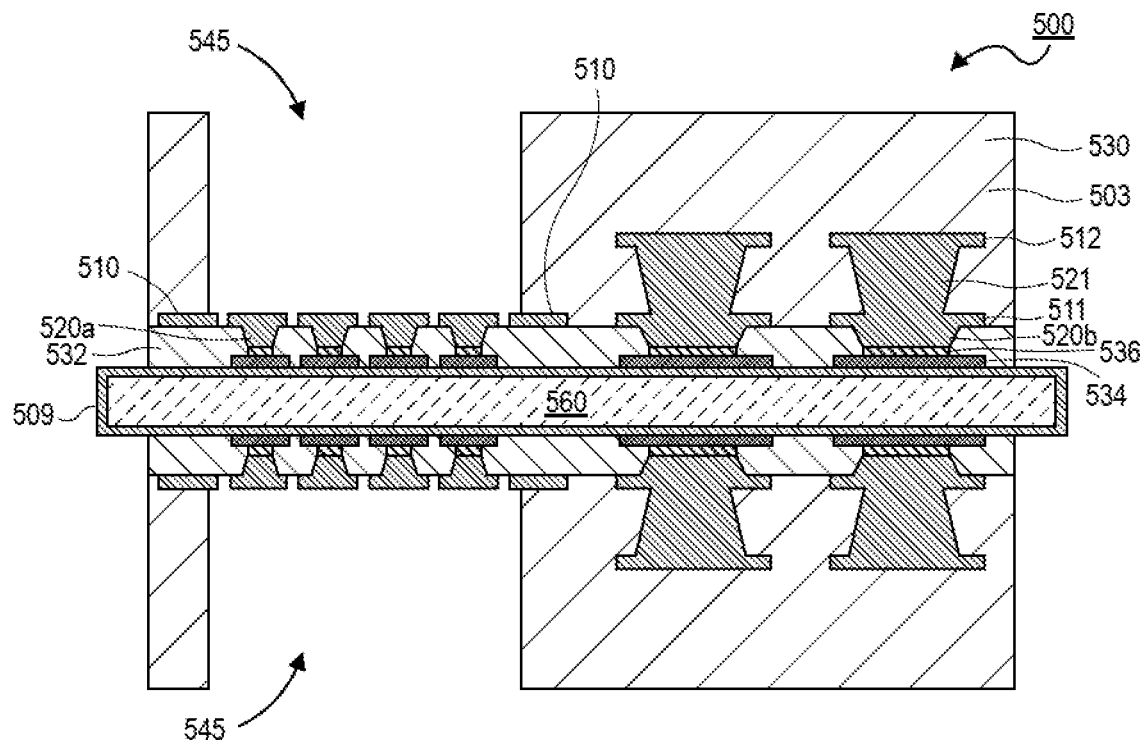

Referring now to FIG. 5C, a cross-sectional illustration of a semiconductor package 500 with a dielectric and cavity formation is shown, in accordance with an embodiment. In an embodiment, the package substrate 503 may include additional dielectric disposed over the dielectric layer 530, the conductive layers 511-512, and the conductive vias 521. Thereafter, in one embodiment, a cavity 545 may be patterned in the dielectric layer 530 to expose the respective first conductive layer 511 that are coupled to the conductive vias 520a and portions of the etch stoppers 510.

Figure 5D:
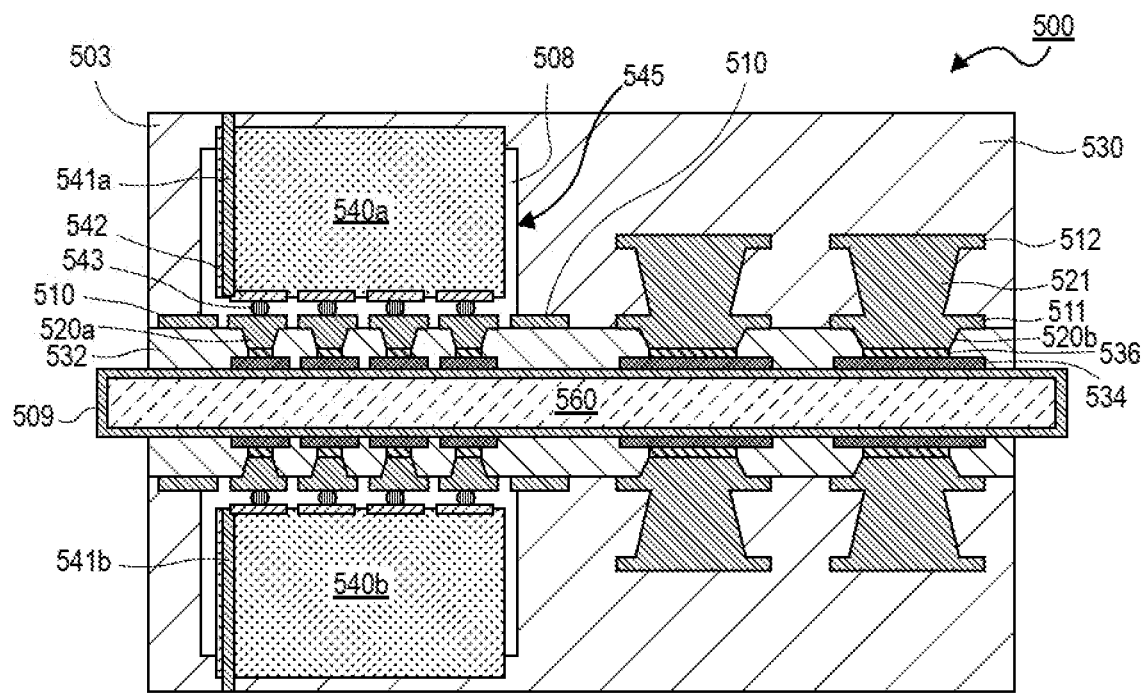

Referring now to FIG. 5D, a cross-sectional illustration of a semiconductor package 500 with an EMIB encapsulation is shown, in accordance with an embodiment. In an embodiment, EMIBs 540a-b may be disposed into the respective cavities 545 and coupled to the first conductive layer 511 and the conductive vias 520a with a plurality of solder balls 543. The EMIBs 540a-b may be substantially similar to the EMIBs 240a-b described above in FIG. 2. In one embodiment, TSVs 541a-b may be disposed in the EMIBs 540a-b and coupled to the conductive pads 542 of the EMIBs 540a-b. After disposing the EMIBs 540a-b, an encapsulation layer 508 may surround the EMIBs 540a-b, the solder balls 543, and the respective first conductive layer 511 below the EMIBs 540a-b. In some embodiments, the dielectric layer 530 may be disposed over the EMIBs 540a-b, the cavity 545, and the encapsulation layer 508, where the TSVs 541a-b may have surfaces that are exposed.

Figure 5E:
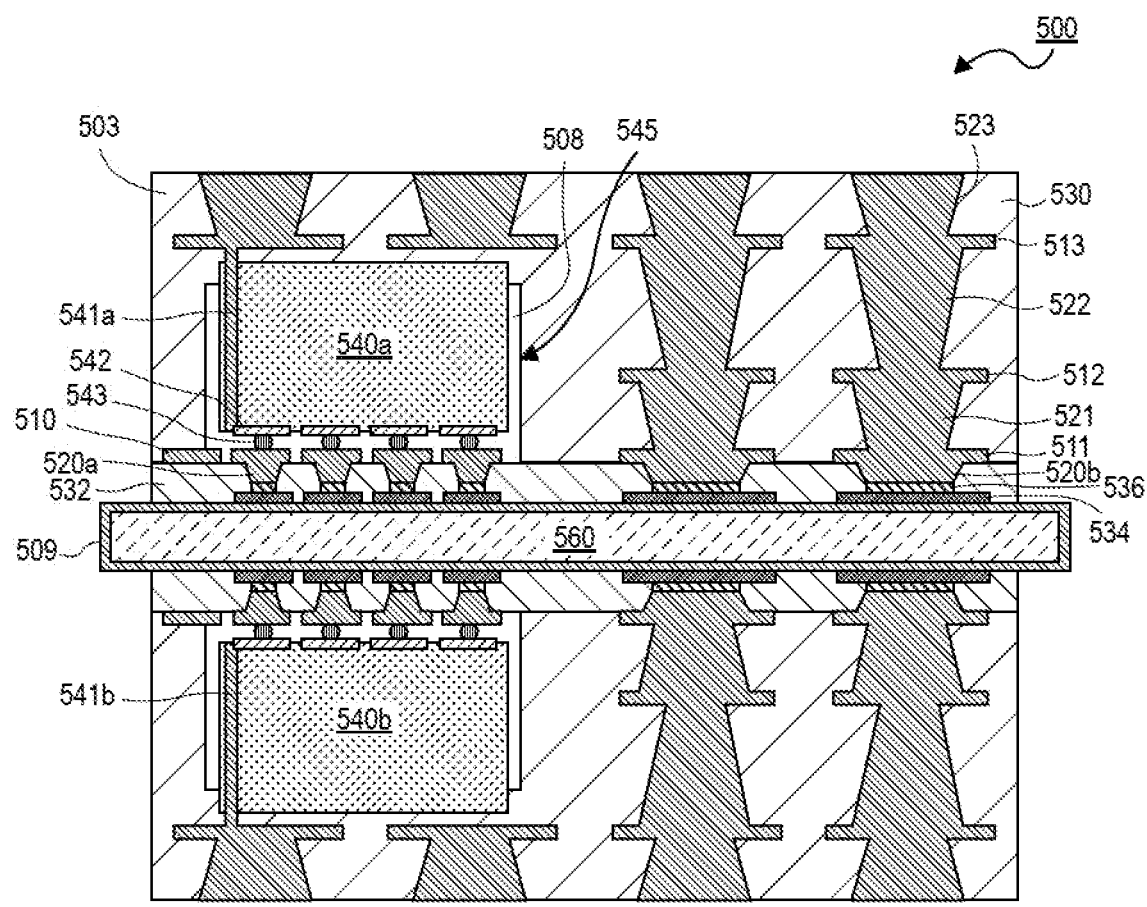

Referring now to FIG. 5E, a cross-sectional illustration of a semiconductor package 500 with a plurality of conductive layers 513 and vias 522-523 is shown, in accordance with an embodiment. In an embodiment, the conductive layer 513 and the vias 522-523 may be disposed in the dielectric layer 530, and over the EMIBs 540a-b and the conductive layers 511-512 and vias 520a-b and 521. The conductive layer 513 may have one or more pads that are coupled to the TSVs 541a-b and disposed over the EMIBs 540a-b, while the other pads of the conductive layer 513 are coupled to the conductive layers 511-512 with the vias 521-523. Note that each of the components illustrated in FIG. 5E may be substantially similar to the respective illustrated and described components of FIGS. 1A-1C and 2.

Also note that the semiconductor package 500 shown in FIGS. 5A-5E may include fewer or additional packaging components based on the desired packaging design.

FIGS. 6A-6F are a series of cross-sectional illustrations that depict a semiconductor package 600 with a package substrate 603, an EMIB 640, and FLIs 636 that are directly patterned and disposed on a carrier 660 first to provide FLIs 636 with flat conductive surfaces and conductive bumps with low BTV, according to some embodiments. The process flow illustrated in FIGS. 6A-6F forms the semiconductor package 600 which is substantially similar to the semiconductor package 400 described above in FIG. 4. Accordingly, as described above, the process flow of semiconductor package 600 illustrates one of the approaches that implements building the critical layer(s) first on the rigid and flat carrier to automatically enable the conductive balls to have a flat bump surface and an accurate controlled solder volume, disposing conductive pillars directly over the critical layer(s), avoiding indirect overlay, using a symmetrical build-up process, and using organic material for the carrier, according to some embodiments.

Figure 6A:
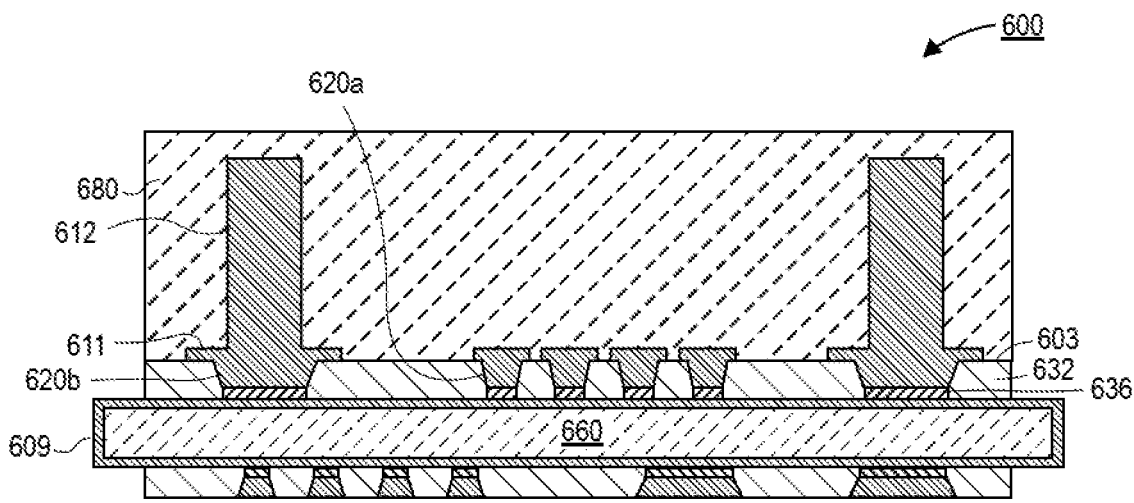
FIGS. 6A-6F are illustrations of cross-sectional views of a process flow to form a semiconductor package with a package substrate, an EMIB, and a plurality of active functional dies powered by a plurality of conductive pillars, where a plurality of TSVs provide power to the EMIBs, according to some embodiments.

Referring now to FIG. 6A, a cross-sectional illustration of a semiconductor package 600 with a symmetrical build-up of the FLIs 636 is shown, in accordance with an embodiment. In an embodiment, the semiconductor package 600 may include a package substrate 603. The package substrate 603 may be substantially similar to the package substrate 403 described above in FIG. 4. In one embodiment, the package substrate 603 may be disposed on a carrier 660 (or a peelable core) that is surrounded with a seed layer 609. The package substrate 603 may include the FLIs 636 disposed in a resist layer 632. In one embodiment, the first conductive layer 611 may be coupled to a plurality of conductive vias 620a-b and a plurality of conductive (or copper) pillars 612. Note that, in an embodiment, the conductive pillars 612 may have different thicknesses initially prior to a first planarization process (e.g., as shown below in FIG. 6B). In some embodiments, the diffusion layer 636 of the FLIs may be coupled directly onto the peelable core 660 with the conductive vias 620a-b. In one embodiment, a resist layer 680 (or a dielectric material) may be disposed over the conductive pillars 612, the first conductive layer 611, and the solder resist 632. For one embodiment, the resist layer 680 may be a dry film resist (DFR) layer or any dielectric material. Note that each of the components illustrated in FIG. 6A may be substantially similar to the respective illustrated and described components of FIGS. 1A and/or 4.

As shown in FIG. 6A, the first conductive layer 611 may have a plurality of first pads coupled to the conductive vias 620a, and a plurality of second pads coupled to the conductive vias 620b, where the conductive vias 620b are directly coupled to the conductive pillars 612. In these embodiments, the first pads of the first conductive layer 611 may have a thickness that is substantially equal to a thickness of the second pads of the first conductive layer 611. Accordingly, the first pads of the first conductive layer 611 may have top surfaces that are substantially coplanar to top surfaces of the second pads of the first conductive layer 611, as a result of patterning and disposing the conductive vias 620a-b and the FLIs 636 directly over the flat surface(s) of the peelable core 660. In one embodiment, the first pads of the first conductive layer 611 may have a width that is less than a width of the second pads of the first conductive layer 611. Respectively, the conductive vias 620a may have a width that is less than a width of the conductive vias 620b, according to an embodiment.

Figure 6B:
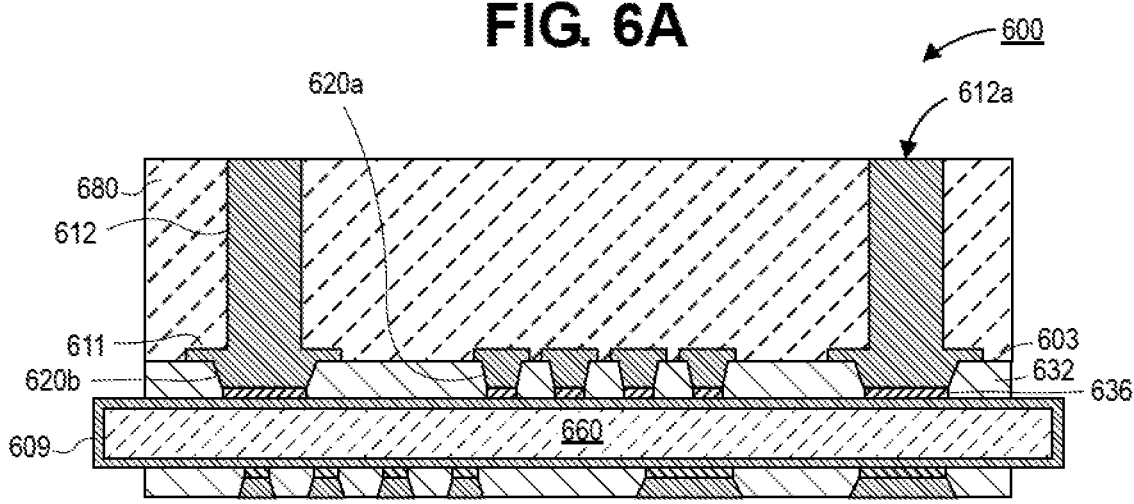

Referring now to FIG. 6B, a cross-sectional illustration of a semiconductor package 600 is shown after a planarization process, in accordance with an embodiment. In an embodiment, the package substrate 603 may planarize the top surface of the resist layer 680 with a chemical-mechanical polishing (CMP) process or the like. For one embodiment, the planarization process may form top surfaces 612a of the conductive pillars 612 that are substantially coplanar to the top surface of the resist layer 680.

Figure 6C:
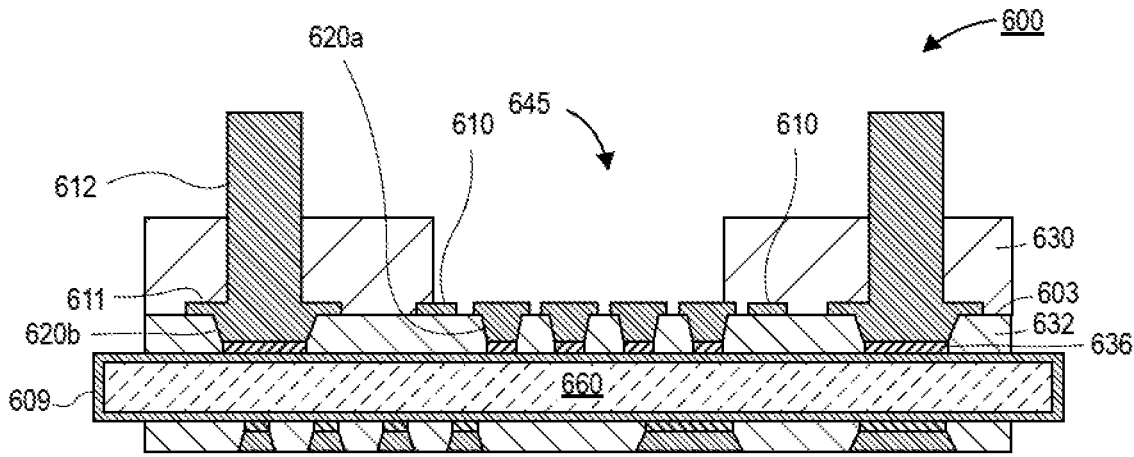

Referring now to FIG. 6C, a cross-sectional illustration of a semiconductor package 600 with a resist layer removal and a cavity formation is shown, in accordance with an embodiment. In an embodiment, after the planarization process, the package substrate 603 may remove (or strip) the resist layer with any process known in the art. In one embodiment, after the top surface of the solder resist layer 632 is exposed, a plurality of etch stoppers 610 may be disposed on the solder resist layer 632 and adjacent to the first conductive layer 611 that are coupled to the conductive vias 620b. For one embodiment, a dielectric layer 630 may then be disposed over the first conductive layer 611, the conductive pillars 612, and the etch stoppers 610. Thereafter, in one embodiment, a cavity 645 may be patterned in the dielectric layer 630 to expose the respective first conductive layer 611 that are coupled to the conductive vias 620a and portions of the etch stoppers 610.

Figure 6D:
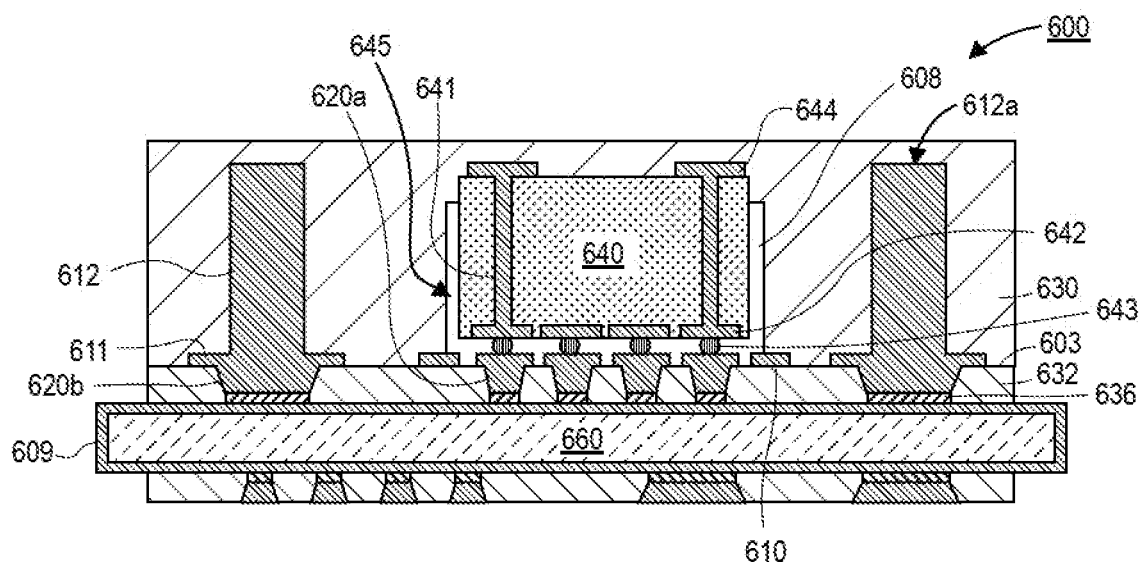

Referring now to FIG. 6D, a cross-sectional illustration of a semiconductor package 600 with an EMIB encapsulation is shown, in accordance with an embodiment. In an embodiment, an EMIB 640 may be disposed into the cavity 645 and coupled to the first conductive layer 611 and the conductive vias 620a with a plurality of solder balls 643. The EMIB 640 may be substantially similar to the EMIBs 240a-b described above in FIG. 2. In one embodiment, TSVs 641 may be disposed in the EMIB 640 and coupled to the conductive pads 642 of the EMIB 640 and conductive pads 644 on the die face of the EMIB 640. After disposing the EMIB 640, an encapsulation layer 608 may surround the EMIB 640, the solder balls 643, and the respective first conductive layer 611 below the EMIB 640. In some embodiments, additional material of the dielectric layer 630 may be disposed over the EMIB 640, the conductive pads 644, the cavity 645, and the encapsulation layer 608, where the dielectric layer 630 may entirely cover the top surfaces 612a of the conductive pillars 612 and the conductive pads 644 of the EMIB 640.

Figure 6E:
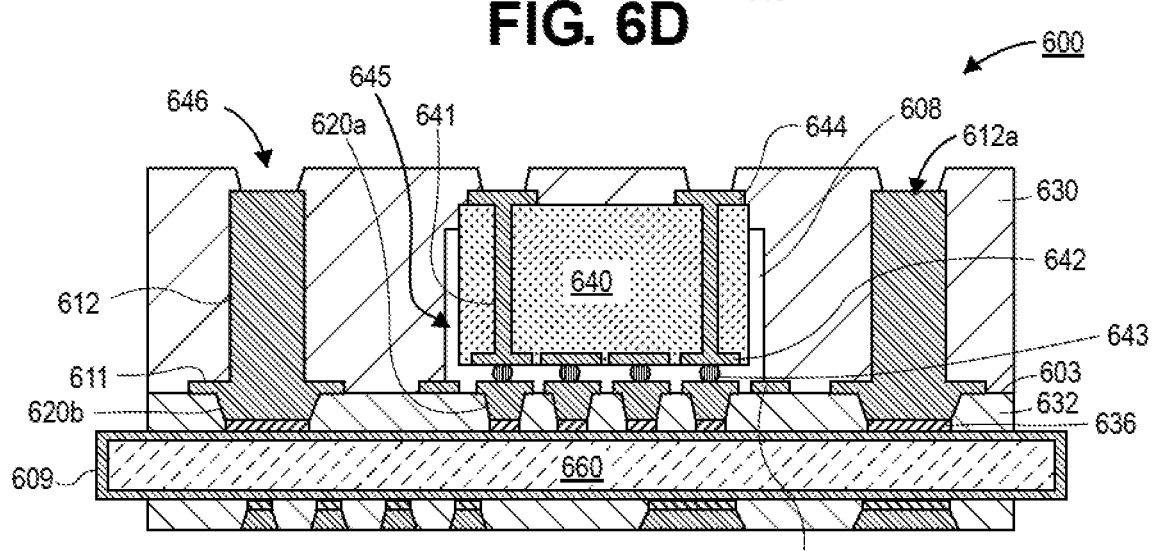

Referring now to FIG. 6E, a cross-sectional illustration of a semiconductor package 600 with a plurality of openings 646 is shown, in accordance with an embodiment. In an embodiment, the openings 646 may be patterned into the dielectric layer 630 to expose the top surfaces 612a of the conductive pillars 612 and the top surfaces of the conductive pads 644, where the exposed top conductive surfaces may be used to subsequently form a plurality of conductive vias as shown below. For example, as the peelable core 660 maintains a substantially flat surface through the process flow, the package substrate 603 may thus maintain an improved BTV as each of the build-up dielectric layers 630 adds weight and maintains (or further flattens) the peelable core substrate/panel 660.

Figure 6F:
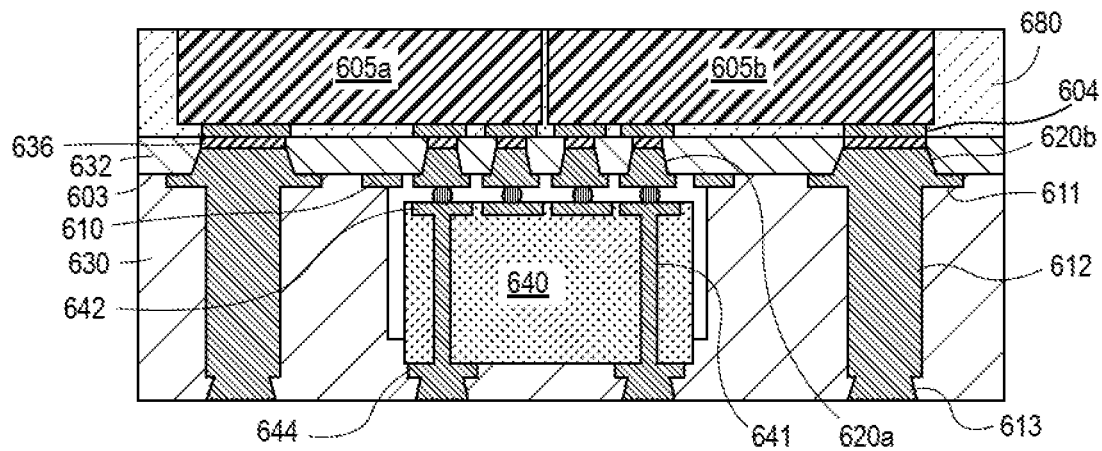

Referring now to FIG. 6F, a cross-sectional illustration of a semiconductor package 600 with a plurality of dies 605a-b and vias 613 is shown, in accordance with an embodiment. In an embodiment, the conductive vias 613 may be disposed in the dielectric layer 630, and over the conductive pads 644 and the conductive pillars 612. In one embodiment, after the via formations, the peelable core and the seed layer may be removed to expose top surfaces of the diffusion layer 636. In some embodiments, the package substrate 603 may be flipped over to dispose and couple the dies 605a-b onto the diffusion layer 636 with a plurality of conductive bumps 604. The dies 605a-b may be substantially similar to the dies 405a-b described above in FIG. 4.

Additionally, as shown in FIG. 6F, an encapsulation layer 680 may be disposed over the dies 605a-b and the solder resist 632, according to one embodiment. In one embodiment, the encapsulation layer 680 may surround the dies 605a-b and the conductive bumps 604 that couple the dies 605a-b to the conductive vias 620a-b and the FLIs 636. In an embodiment, the encapsulation layer 680 may be disposed over the top surfaces of the dies 605a-b, and subsequently planarized to have a top surface that is substantially coplanar to the top surface of the dies 605a-b. The EMIB 640 may communicatively couple the die 605a to the die 605b. Note that each of the components illustrated in FIG. 6F may be substantially similar to the respective illustrated and described components of FIGS. 1A-1C and 4.

Also note that the semiconductor package 600 shown in FIGS. 6A-6F may include fewer or additional packaging components based on the desired packaging design.

FIGS. 7A-7F are a series of plan illustrations that depict a process flow 700 to pattern a plurality of cavities 745 in a package substrate 703, according to some embodiments. The process flow 700 illustrated in FIGS. 7A-7F forms a semiconductor package which is substantially similar to the semiconductor packages described above (e.g., similar to the semiconductor package 100 of FIGS. 1A-1C). Accordingly, as described above, the process flow 700 illustrates one of the approaches to form (or pattern) the cavities in/on the package substrate using a removable ZnO material as an etch stop layer (or an UV-laser stopper material) for the patterned cavities, according to some embodiments.

Referring now to FIG. 7A, a cross-sectional illustration of a package substrate 703 is shown, in accordance with an embodiment. In an embodiment, the process flow 700 may pattern a plurality of cavities 745 onto the package substrate 703. The package substrate 703 may be substantially similar to the package substrate 103 described above in FIGS. 1A-1C. The patterned cavities 745 may be substantially similar to the cavities 145 described above in FIGS. 1A-1C. For some embodiments, a conductive (or copper) layer 731 may cover the package substrate 703. In one embodiment, a mask-assisted sputtering of an etch stop layer 741 (or an etch stop material) may be disposed onto the pattern containing layer of the package substrate 703. In one embodiment, the etch stop layer 741 may include ZnO or similar UV-laser stopper materials. Accordingly, the patterned ZnO layers 741 may be sputtered and used as laser stoppers for a subsequent laser process implemented below in FIG. 7C.

Referring now to FIG. 7B, a cross-sectional illustration of a package substrate 703 is shown after a dielectric is disposed, in accordance with an embodiment. In an embodiment, the process flow 700 may dispose a dielectric layer 730 over the cavities 745, the etch stop layers 741, and the package substrate 703. In one embodiment, the dielectric layer 730 may be laminated and cured over the package substrate 703.

Referring now to FIG. 7C, a cross-sectional illustration of a package substrate 703 is shown after a laser cutting process/cavity definition step, in accordance with an embodiment. In an embodiment, the process flow 700 may form a laser cut-out portion 746 (or a lasered/patterned portion) through the dielectric layer 730 to pattern the cavities 745 of the package substrate 703. In one embodiment, the cavities 745 may have the outer edges patterned by the lasered portion 746 with a laser or a similar tool/process. For example, the patterned ZnO layers 741 may be implemented as laser stoppers for the laser.

Referring now to FIG. 7D, a cross-sectional illustration of a package substrate 703 is shown after an etching process, in accordance with an embodiment. In an embodiment, the process flow 700 may etch away the etch stop layers to expose the conductive surfaces 731 over the patterned cavities 745 of the package substrate 703. For example, the process flow 700 may implement the etching only within the lasered edges of the cavities 745 to form the illustrated openings over the package substrate 703. Some of the advantages of using ZnO or the similar materials is that no dielectric and/or ZnO residue is left, no mechanical removal of the dielectric is needed, and no obtrusions in/on the dielectric is thus implemented.

Referring now to FIG. 7E, a cross-sectional illustration of a package substrate 703 is shown after an EMIB is disposed, in accordance with an embodiment. In an embodiment, the process flow 700 may dispose a plurality of EMIBs 740 into the cavities 740 of the package substrate 703. The EMIBs 740 may be substantially similar to the EMIBs 140a-b of FIGS. 1A-1C. In one embodiment, the EMIBs 740 are disposed on the conductive layer 731 such as the first conductive layer, where the EMIBs 740 may be coupled to the first conductive layer of the package substrate 703 with a plurality of solder balls.

Referring now to FIG. 7F, a cross-sectional illustration of a package substrate 703 is shown after an underfill material is disposed, in accordance with an embodiment. In an embodiment, the process flow 700 may dispose an encapsulating layer 708 over the cavities 745 of the package substrate 703 to surround the EMIBs 740, portions of the conductive layer 731, and the solder balls. The encapsulating layer 708 may be substantially similar to the encapsulating layer 108 of FIGS. 1A-1C. In one embodiment, additional dielectric material may be disposed over the encapsulation layer 708, the EMIBs 740, and the package substrate 703 in a subsequent step as described above.

Note that the semiconductor package formed with the process flow 700 of FIGS. 7A-7F may include fewer or additional packaging steps and/or components based on the desired packaging design.

FIGS. 8A-8H are a series of plan illustrations that depict a process flow 800 to pattern a plurality of cavities 845 in a package substrate 803, according to some embodiments. The process flow 800 illustrated in FIGS. 8A-8H forms a semiconductor package which is substantially similar to the semiconductor packages described above (e.g., similar to the semiconductor package 100 of FIGS. 1A-1C). Accordingly, as described above, the process flow 800 illustrates one of the approaches to form (or pattern) the cavities in/on the package substrate using a copper layer (or copper rings) as an etch/laser stop layer for the patterned cavities, according to some embodiments.

Referring now to FIG. 8A, a cross-sectional illustration of a package substrate 803 is shown, in accordance with an embodiment. In one embodiment, the process flow 800 may dispose an adhesive layer 881 over the pattern-containing package substrate 803. The package substrate 803 may be substantially similar to the package substrate 103 described above in FIGS. 1A-1C. The adhesive layer 881 may be a protective adhesive or the like, including a polyethylene terephthalate (PET) film, and/or a polyester film. For some embodiments, a conductive (or copper) layer 831 may cover the package substrate 803, as such the adhesive layer 881 may be disposed over the conductive layer 831 of the package substrate 803.

Referring now to FIG. 8B, a cross-sectional illustration of a package substrate 803 is shown after a laser cutting process, in accordance with an embodiment. In an embodiment, the process flow 800 may form a laser cut-out portion 844 (or a lasered/patterned portion) through the adhesive layer 881 of the package substrate 803. For one embodiment, an etch stop layer 810 may be patterned and disposed on the package substrate 803. In one embodiment, the etch stop layer 810 may be a copper ring/layer (or a copper laser/etch stopper) or the like that is separated from the conductive layer 831 by the lasered portion 844. The etch stop layer 810 may be contained on the package substrate 803 to facilitate in subsequently forming the external edges of the cavities 845 (as shown below in FIG. 8E). In one embodiment, the copper laser stopper ring 810 may have the outer edges patterned by the lasered portion 844 with a laser or a similar tool/process.

Referring now to FIG. 8C, a cross-sectional illustration of a package substrate 803 is shown after the adhesive layer is removed while the protective film in the cavity still remains, in accordance with an embodiment. In one embodiment, the process flow 800 may remove the adhesive layer to expose the patterned conductive layer 831 of the package substrate 803. For one embodiment, after the removal of the adhesive layer while the cavities 845 remain covered with the protective film, the rest of the patterns of the substrate 803 are all exposed.

Referring now to FIG. 8D, a cross-sectional illustration of a package substrate 803 is shown after a dielectric is disposed, in accordance with an embodiment. In one embodiment, the process flow 800 may dispose a dielectric layer 830 over the entire substrate, and the conductive layer 831 of the package substrate 803. In one embodiment, the dielectric layer 830 may be laminated and cured over the package substrate 803.

Referring now to FIG. 8E, a cross-sectional illustration of a package substrate 803 is shown after a laser cutting process, in accordance with an embodiment. In an embodiment, the process flow 800 may form a laser cut-out portion 846 through the dielectric layer 830 to pattern the cavities 845 of the package substrate 803. In one embodiment, the cavities 845 may have the outer edges patterned by the lasered portion 846 with a laser or a similar tool/process. For example, the patterned copper ring may be implemented as laser stoppers for the laser.

Referring now to FIG. 8F, a cross-sectional illustration of a package substrate 803 is shown after portions of the dielectric are removed, in accordance with an embodiment. In an embodiment, the process flow 800 may pattern the dielectric layer 830 to form the cavities 845 and expose the conductive layer 831 of the package substrate 803. In one embodiment, the removed portions of the dielectric layer 830 may be implemented with an etching process or the like.

Referring now to FIG. 8G, a cross-sectional illustration of a package substrate 803 is shown after an EMIB is disposed, in accordance with an embodiment. In an embodiment, the process flow 800 may dispose a plurality of EMIBs 840 into the cavities 845 of the package substrate 803. The EMIBs 840 may be substantially similar to the EMIBs 240a-b and 340a-b of FIGS. 2-3. In one embodiment, the EMIBs 840 are disposed on the conductive layer 831 such as the first conductive layer, where the EMIBs 840 may be coupled to the first conductive layer of the package substrate 803 with a plurality of solder balls. In these embodiments, the EMIBs 840 may be powered by TSVs and/or conductive layers in the first conductive layer (e.g., as shown with the TSVs in FIG. 2 and the first conductive layer in FIG. 3).

Referring now to FIG. 8H, a cross-sectional illustration of a package substrate 803 is shown after an underfill material is disposed, in accordance with an embodiment. In an embodiment, the process flow 800 may dispose an encapsulating layer 808 over the cavities 845 of the package substrate 803 to surround the EMIBs 840, portions of the conductive layer 831, and the solder balls. The encapsulating layer 808 may be substantially similar to the encapsulating layer 108 of FIGS. 1A-1C. In one embodiment, additional dielectric material may be disposed over the encapsulation layer 808, the EMIBs 840, and the package substrate 803 in a subsequent step as described above.

Note that the semiconductor package formed with the process flow 800 of FIGS. 8A-8H may include fewer or additional packaging steps and/or components based on the desired packaging design.

Figure 9:
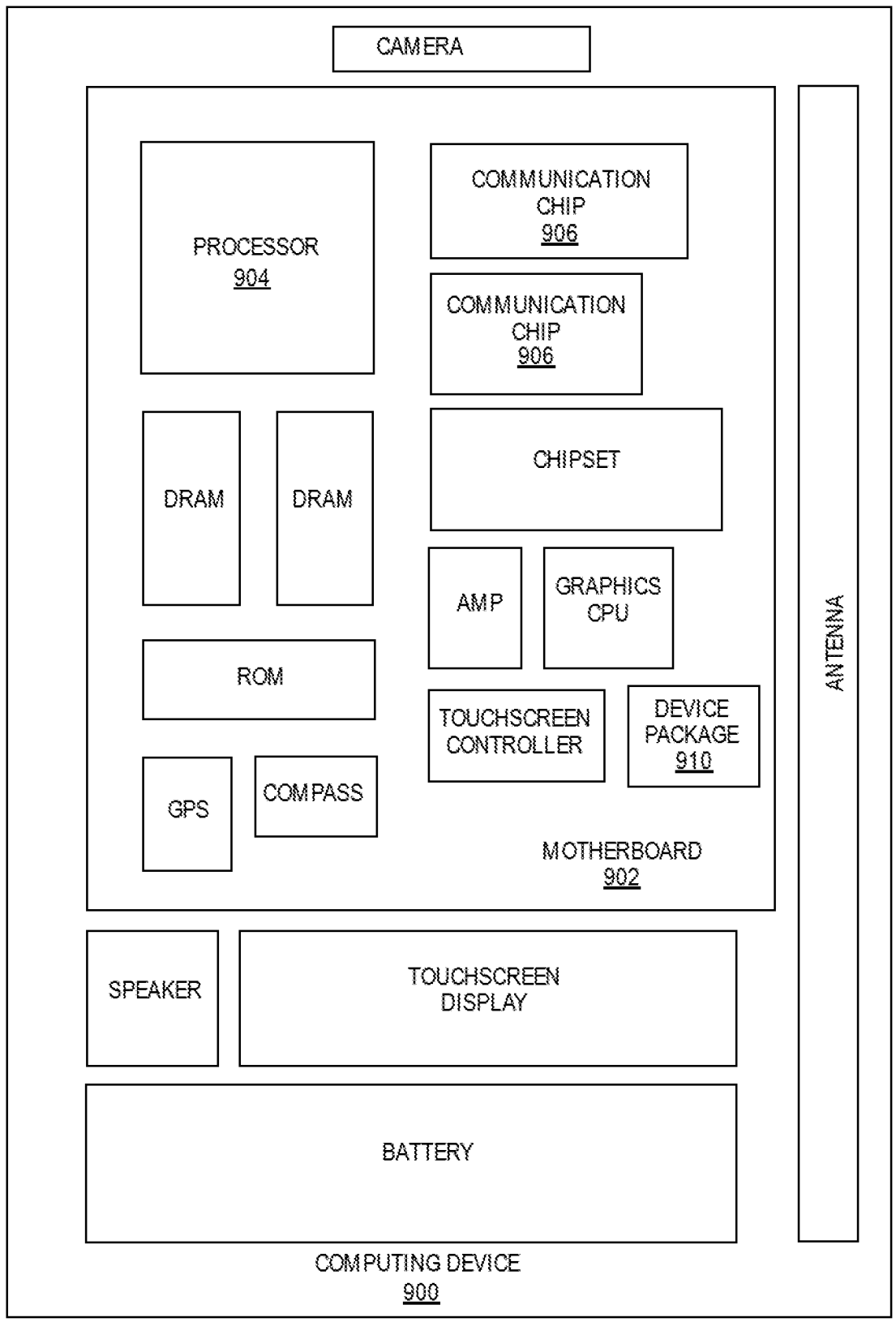
FIG. 9 is an illustration of a schematic block diagram illustrating a computer system that utilizes a semiconductor package with a package substrate, an EMIB, and FLIs that provide flat bump surfaces and solder bumps with low BTV, where the FLIs have the highest stringent overlay and high-density requirements, according to one embodiment.

FIG. 9 is an illustration of a schematic block diagram illustrating a computer system 900 that utilizes a device package 910 (or a semiconductor package) with a package substrate, an EMIB, and FLIs that provide flat bump surfaces and solder bumps with low BTV, where the FLIs and metal surface layer have the highest stringent overlay and high-density requirements, according to one embodiment. FIG. 9 illustrates an example of computing device 900. Computing device 900 houses motherboard 902. Motherboard 902 may include a number of components, including but not limited to processor 904, device package 910 (or semiconductor package), and at least one communication chip 906. Processor 904 is physically and electrically coupled to motherboard 902. For some embodiments, at least one communication chip 906 is also physically and electrically coupled to motherboard 902. For other embodiments, at least one communication chip 906 is part of processor 904.

Depending on its applications, computing device 900 may include other components that may or may not be physically and electrically coupled to motherboard 902. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

At least one communication chip 906 enables wireless communications for the transfer of data to and from computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. At least one communication chip 906 may implement any of a number of wireless standards or protocols, including but not limited to Wi-Fi (IEEE 802.11 family), WiMAX (IEEE 802.112 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 900 may include a plurality of communication chips 906. For instance, a first communication chip 906 may be dedicated to shorter range wireless communications such as Wi-Fi and Bluetooth and a second communication chip 906 may be dedicated to longer range wireless communications such as GPS, EDGE, GPRS, CDMA, WiMAX, LTE, Ev-DO, and others.

Processor 904 of computing device 900 includes an integrated circuit die packaged within processor 904. Device package 910 may be, but is not limited to, a substrate, a package substrate, and/or a PCB. In one embodiment, device package 910 may be a semiconductor package as described herein. Device package 910 may include EMIBs, conductive layers, and/or patterned etch stoppers, where the conductive layers include FLIs that are initially patterned and disposed over a rigid and flat carrier enabling solder bumps with flat surfaces and low BTV (e.g., as illustrated in FIGS. 1A-6F)—or any other components from the figures described herein.

Note that device package 910 may be a single component/device, a subset of components, and/or an entire system, as the materials, features, and components may be limited to device package 910 and/or any other component of the computing device 900 that may need the coreless EMIB-based package substrates with high accuracy and high density as described herein (e.g., the motherboard 902, the processor 904, and/or any other component of the computing device 900 may need the embodiments of the semiconductor packages as described herein).

For certain embodiments, the integrated circuit die may be packaged with one or more devices on a package substrate that includes a thermally stable RFIC and antenna for use with wireless communications and the device package, as described herein, to reduce the z-height of the computing device. The term "processor" may refer to any device or portion of a device that processes electronic data from registers and/or memory to transform that electronic data into other electronic data that may be stored in registers and/or memory.

At least one communication chip 906 also includes an integrated circuit die packaged within the communication chip 906. For some embodiments, the integrated circuit die of the communication chip may be packaged with one or more devices on a package substrate that includes one or more device packages, as described herein.

In the foregoing specification, embodiments have been described with reference to specific exemplary embodiments thereof. It should be borne in mind, however, that all of these and similar terms are to be associated with the appropriate physical quantities and are merely convenient labels applied to these quantities. It will be evident that various modifications may be made thereto without departing from the broader spirit and scope. The specification and drawings are, accordingly, to be regarded in an illustrative sense rather than a restrictive sense.

The following examples pertain to further embodiments. The various features of the different embodiments may be variously combined with some features included and others excluded to suit a variety of different applications.

The following examples pertain to further embodiments:

Example 1 is a semiconductor package, comprising: a plurality of conductive layers over a package substrate, wherein the plurality of conductive layers include a first conductive layer and first-level interconnects (FLIs) in the package substrate; a solder resist surrounds the FLIs, wherein the solder resist has a top surface that is substantially coplanar to a plurality of top surfaces of the FLIs; a bridge coupled directly to the first conductive layer with a plurality of solder balls, wherein the first conductive layer is coupled to the FLIs; and a dielectric over the plurality of conductive layers, the bridge, and the solder resist of the package substrate.

In example 2, the subject matter of example 1 can optionally include that the bridge is an embedded multi-die interconnect bridge (EMIB).

In example 3, the subject matter of examples 1-2 can optionally include that the first conductive layer includes a plurality of first conductive pads and a plurality of second conductive pads, and wherein the FLIs include a plurality of first conductive vias, a plurality of second conductive vias, a plurality of diffusion layers, and a plurality of third conductive pads.

In example 4, the subject matter of example 3 can optionally include that the plurality of first conductive pads are coupled to the plurality of third conductive pads with the plurality of first conductive vias and diffusion layers, wherein the plurality of second conductive pads are coupled to the plurality of third conductive pads with the plurality of second conductive vias and diffusion layers, wherein the plurality of diffusion layers are between the plurality of third conductive pads and the plurality of first and second conductive vias, wherein the plurality of first and second conductive vias have top surfaces and bottom surfaces that are opposite to the top surfaces, and wherein the top surfaces of the plurality of first and second conductive vias are coupled directly to the plurality of diffusion layers.

In example 5, the subject matter of example 4 can optionally include that the top surfaces of the plurality of first and second vias have a width that is less than a width of the bottom surfaces of the plurality of first and second vias.

In example 6, the subject matter of example 3 can optionally include that the plurality of top surfaces of the FLIs are top surfaces of the plurality of third conductive pads, and wherein the plurality of first and second conductive pads are on the solder resist.

In example 7, the subject matter of example 3 can optionally include a conductive ring layer on the solder resist, wherein the conductive ring layer surrounds the plurality of first conductive pads; a plurality of conductive pads on a bottom surface of the bridge, wherein the bottom surface of the bridge is opposite to a top surface of the bridge, and wherein the plurality of conductive pads of the bridge are coupled directly to the plurality of first conductive pads of the first conductive layer with the plurality of solder bumps; and an encapsulation layer surrounds the plurality of first conductive pads, the plurality of solder bumps, a portion of the conductive ring layer, and a portion of the bridge.

In example 8, the subject matter of example 7 can optionally include that the plurality of first conductive vias have a thickness that is substantially equal to a thickness of the plurality of second conductive vias, wherein the conductive ring layer has a thickness that is substantially equal to a thickness of the plurality of first and second conductive pads, and wherein the plurality of first conductive pads have a width that is less than a width of the plurality of second conductive pads.

In example 9, the subject matter of example 7 can optionally include that the dielectric is between and surrounds the top surface of the bridge and a third conductive layer of the plurality of conductive layers, wherein the conductive ring layer includes one or more conductive materials, wherein the one or more conductive materials include copper, zinc oxide, ferric oxide, or copper oxide, wherein the bridge is coupled to a power source with a through silicon via (TSV) or a conductive layer of the FLIs when the conductive ring layer is a copper ring layer, wherein the conductive layer of the FLIs is on and coupled to one or more of the plurality of first vias, and wherein the TSV couples the third conductive layer to the plurality of conductive pads of the bridge.

Example 10 is a semiconductor package, comprising: a plurality of conductive layers over a package substrate, wherein the plurality of conductive layers include a first conductive layer and FLIs in the package substrate; a plurality of conductive pillars coupled to the first conductive layer and the FLIs, wherein the first conductive layer is coupled to the FLIs; a solder resist surrounds the FLIs, wherein the solder resist has a top surface that is substantially coplanar to a plurality of top surfaces of the FLIs; a bridge coupled directly to the first conductive layer with a plurality of solder balls; a dielectric over the plurality of conductive layers, the plurality of conductive pillars, the bridge, and the solder resist of the package substrate; and a plurality of dies over the package substrate, wherein the plurality of dies are coupled directly to the FLIs with a plurality of conductive bumps, and wherein the plurality of dies are communicatively coupled with the bridge.

In example 11, the subject matter of example 10 can optionally include that the bridge is an EMIB, and wherein the first conductive layer includes a plurality of first conductive pads and a plurality of second conductive pads, and wherein the FLIs include a plurality of first conductive vias, a plurality of second conductive vias, and a plurality of diffusion layers.

In example 12, the subject matter of examples 10-11 can optionally include that the plurality of first conductive pads are coupled to the plurality of diffusion layers with the plurality of first conductive vias, wherein the plurality of second conductive pads are coupled to the plurality of diffusion layers with the plurality of second conductive vias, wherein the plurality of diffusion layers are between the plurality of conductive bumps and the plurality of first and second conductive vias, wherein the plurality of first and second conductive vias have top surfaces and bottom surfaces that are opposite to the top surfaces, and wherein the top surfaces of the plurality of first and second conductive vias are coupled directly to the plurality of diffusion layers.

In example 13, the subject matter of example 12 can optionally include that the top surfaces of the plurality of first and second vias have a width that is less than a width of the bottom surfaces of the plurality of first and second vias.

In example 14, the subject matter of example 11 can optionally include that the plurality of top surfaces of the FLIs are top surfaces of the plurality of diffusion layers, wherein the plurality of first and second conductive pads are on the solder resist, and wherein the plurality of diffusion layers are coupled directly to the plurality of conductive bumps and the plurality of first and second conductive vias.

In example 15, the subject matter of example 11 can optionally include a conductive ring layer on the solder resist, wherein the conductive ring layer surrounds the plurality of first conductive pads; a plurality of third conductive pads on a bottom surface of the bridge, and a plurality of fourth conductive pads on a top surface of the bridge, wherein the bottom surface of the bridge is opposite to the top surface of the bridge, and wherein the plurality of third conductive pads of the bridge are coupled directly to the plurality of first conductive pads of the first conductive layer with the plurality of solder bumps; a first encapsulation layer surrounds the plurality of first conductive pads, the plurality of solder bumps, a portion of the conductive ring layer, and a portion of the bridge; and a second encapsulation layer over the plurality of dies and the package substrate, wherein the second encapsulation layer surrounds the conductive bumps.

In example 16, the subject matter of example 15 can optionally include that the plurality of first conductive vias have a thickness that is substantially equal to a thickness of the plurality of second conductive vias, wherein the conductive ring layer has a thickness that is substantially equal to a thickness of the plurality of first and second conductive pads, and wherein the plurality of first conductive pads have a width that is less than a width of the plurality of second conductive pads.

In example 17, the subject matter of example 16 can optionally include that the dielectric surrounds the plurality of fourth conductive pads and the top surface of the bridge, wherein the plurality of conductive layers includes a plurality of third vias that are coupled to the plurality of conductive pillars and fourth conductive pads, wherein the conductive ring layer includes one or more conductive materials, wherein the one or more conductive materials include copper, zinc oxide, ferric oxide, or copper oxide, wherein the bridge has a plurality of TSVs coupled to the plurality of third and fourth conductive pads of the bridge, wherein the bridge is coupled to a power source with the plurality of TSVs or a conductive layer of the FLIs when the conductive ring layer is a copper ring layer, and wherein the conductive layer of the FLIs is on and coupled to one or more of the plurality of first vias.

Example 18 is a method for forming a semiconductor package, comprising: disposing a plurality of FLIs on a first surface of a carrier, wherein the carrier includes a seed layer and a releasable substrate, and wherein the seed layer is attached to the releasable substrate; disposing a solder resist on the carrier, and a first conductive layer over the solder resist, wherein the first conductive layer is coupled to the FLIs, wherein the solder resist surrounds the FLIs to form a first package substrate, wherein the first conductive layer includes a plurality of first conductive pads and a plurality of second conductive pads, wherein the FLIs include a plurality of first conductive vias, a plurality of second conductive vias, a plurality of diffusion layers, and a plurality of third conductive pads, and wherein the solder resist and the third conductive pads are directly on the seed layer of the carrier; disposing a dielectric over the first conductive layer and the solder resist of the first package substrate; disposing a second conductive layer through the dielectric, wherein the second conductive layer is over and coupled to the plurality of second conductive pads with a plurality of third conductive vias; patterning the dielectric to form a cavity over the plurality of first conductive pads; disposing a bridge into the cavity and over the plurality of first conductive pads, wherein the bridge is directly coupled to the plurality of first conductive pads with a plurality of solder balls; disposing the dielectric over the bridge, the first and second conductive layers, and the first package substrate; disposing a third conductive layer through the dielectric, wherein the third conductive layer is over the bridge and the second conductive layer, wherein the third conductive layer is coupled to the second conductive layer with a plurality of fourth vias, wherein a plurality of fifth vias are on the third conductive layer, and wherein the dielectric has a surface that is substantially coplanar to a plurality of surfaces of the plurality of fifth vias; separating the releasable substrate of the carrier from the seed layer, wherein the seed layer remains coupled to the first package substrate; and removing the seed layer to expose a plurality of surfaces of the third conductive pads of the FLIs, wherein the solder resist has a surface that is substantially coplanar to the plurality of surfaces of the third conductive pads of the FLIs.

In example 19, the subject matter of example 18 can optionally include a second package substrate is symmetrically formed over a second surface of the carrier substantially in parallel with the formation of the first package substrate, and wherein the first package substrate is formed above the carrier, and the second package substrate is formed below the carrier.

In example 20, the subject matter of examples 18-19 can optionally include that the bridge is an EMIB.

In example 21, the subject matter of examples 18-20 can optionally include that the plurality of first conductive pads are coupled to the plurality of third conductive pads with the plurality of first conductive vias and diffusion layers, wherein the plurality of second conductive pads are coupled to the plurality of third conductive pads with the plurality of second conductive vias and diffusion layers, wherein the plurality of diffusion layers are between the plurality of third conductive pads and the plurality of first and second conductive vias, wherein the plurality of first and second conductive vias have top surfaces and bottom surfaces that are opposite to the top surfaces, and wherein the top surface of the plurality of first and second conductive vias are coupled directly to the plurality of diffusion layers.

In example 22, the subject matter of examples 18-21 can optionally include that the top surfaces of the plurality of first and second vias have a width that is less than a width of the bottom surfaces of the plurality of first and second vias, and wherein the plurality of first and second conductive pads are on the solder resist.

In example 23, the subject matter of examples 18-22 can optionally include disposing a conductive ring layer on the solder resist, wherein the conductive ring layer surrounds the plurality of first conductive pads, wherein a plurality of conductive pads are on a bottom surface of the bridge, wherein the bottom surface of the bridge is opposite to a top surface of the bridge, and wherein the plurality of conductive pads of the bridge are coupled directly to the plurality of first conductive pads of the first conductive layer with the plurality of solder bumps; and disposing an encapsulation layer in the cavity to surround the plurality of first conductive pads, the plurality of solder bumps, a portion of the conductive ring layer, and a portion of the bridge.

In example 24, the subject matter of example 23 can optionally include that the plurality of first conductive vias have a thickness that is substantially equal to a thickness of the plurality of second conductive vias, wherein the conductive ring layer has a thickness that is substantially equal to a thickness of the plurality of first and second conductive pads, and wherein the plurality of first conductive pads have a width that is less than a width of the plurality of second conductive pads.

In example 25, the subject matter of example 23 can optionally include that the dielectric is between and surrounds the top surface of the bridge and the third conductive layer, wherein the conductive ring layer includes one or more conductive materials, wherein the one or more conductive materials include copper, zinc oxide, ferric oxide, or copper oxide, wherein the bridge is coupled to a power source with a TSV or a conductive layer of the FLIs when the conductive ring layer is a copper ring layer, wherein the conductive layer of the FLIs is on and coupled to one or more of the plurality of first vias, and wherein the TSV couples the third conductive layer to the plurality of conductive pads of the bridge.

In the foregoing specification, methods and apparatuses have been described with reference to specific exemplary embodiments thereof. It will be evident that various modifications may be made thereto without departing from the broader spirit and scope. The specification and drawings are, accordingly, to be regarded in an illustrative sense rather than a restrictive sense.

What is claimed is:

1. A semiconductor package, comprising:
    a plurality of conductive layers over a package substrate, wherein the plurality of conductive layers include a first conductive layer and first-level interconnects (FLIs) in the package substrate;
    a solder resist surrounding the FLIs, wherein the solder resist has a top surface that is substantially coplanar to a plurality of top surfaces of the FLIs;
    a bridge having a top with conductive pads, the conductive pads coupled directly to the first conductive layer with a plurality of solder balls, the bridge in a cavity in the package substrate, and the bridge having sidewalls, wherein the first conductive layer is coupled to the FLIs;
    an encapsulation layer laterally surrounding the bridge in the cavity, the encapsulation layer on the top of the bridge and in contact with the conductive pads of the bridge, the encapsulation layer along less than an entirety of the sidewalls of the bridge, and the encapsulation layer having a bottommost surface above a bottommost surface of the bridge; and
    a dielectric over the plurality of conductive layers, the bridge, and the solder resist of the package substrate.

2. The semiconductor package of claim 1, wherein the bridge is an embedded multi-die interconnect bridge (EMIB).

3. The semiconductor package of claim 1, wherein the first conductive layer includes a plurality of first conductive pads and a plurality of second conductive pads, and wherein the FLIs include a plurality of first conductive vias, a plurality of second conductive vias, a plurality of diffusion layers, and a plurality of third conductive pads.

4. The semiconductor package of claim 3, wherein the plurality of first conductive pads are coupled to the plurality of third conductive pads with the plurality of first conductive vias and diffusion layers, wherein the plurality of second conductive pads are coupled to the plurality of third conductive pads with the plurality of second conductive vias and diffusion layers, wherein the plurality of diffusion layers are between the plurality of third conductive pads and the plurality of first and second conductive vias, wherein the plurality of first and second conductive vias have top surfaces and bottom surfaces that are opposite to the top surfaces, and wherein the top surfaces of the plurality of first and second conductive vias are coupled directly to the plurality of diffusion layers.

5. The semiconductor package of claim 4, wherein the top surfaces of the plurality of first and second vias have a width that is less than a width of the bottom surfaces of the plurality of first and second vias.

6. The semiconductor package of claim 3, wherein the plurality of top surfaces of the FLIs are top surfaces of the plurality of third conductive pads, and wherein the plurality of first and second conductive pads are on the solder resist.

7. The semiconductor package of claim 3, further comprising:
    a conductive ring layer on the solder resist, wherein the conductive ring layer surrounds the plurality of first conductive pads;
    a plurality of conductive pads on a bottom surface of the bridge, wherein the bottom surface of the bridge is opposite to a top surface of the bridge, and wherein the plurality of conductive pads of the bridge are coupled directly to the plurality of first conductive pads of the first conductive layer with the plurality of solder bumps; and
    an encapsulation layer surrounds the plurality of first conductive pads, the plurality of solder bumps, a portion of the conductive ring layer, and a portion of the bridge.

8. The semiconductor package of claim 7, wherein the plurality of first conductive vias have a thickness that is substantially equal to a thickness of the plurality of second conductive vias, wherein the conductive ring layer has a thickness that is substantially equal to a thickness of the plurality of first and second conductive pads, and wherein the plurality of first conductive pads have a width that is less than a width of the plurality of second conductive pads.

9. The semiconductor package of claim 7, wherein the dielectric is between and surrounds the top surface of the bridge and a third conductive layer of the plurality of conductive layers, wherein the conductive ring layer includes one or more conductive materials, wherein the one or more conductive materials include copper, zinc oxide, ferric oxide, or copper oxide, wherein the bridge is coupled to a power source with a through silicon via (TSV) or a conductive layer of the FLIs when the conductive ring layer is a copper ring layer, wherein the conductive layer of the FLIs is on and coupled to one or more of the plurality of first vias, and wherein the TSV couples the third conductive layer to the plurality of conductive pads of the bridge.

10. A semiconductor package, comprising:
    a plurality of conductive layers over a package substrate, wherein the plurality of conductive layers include a first conductive layer and FLIs in the package substrate;
    a plurality of conductive pillars coupled to the first conductive layer and the FLIs, wherein the first conductive layer is coupled to the FLIs;
    a solder resist surrounding the FLIs, wherein the solder resist has a top surface that is substantially coplanar to a plurality of top surfaces of the FLIs;
    a bridge having a top with conductive pads, the conductive pads coupled directly to the first conductive layer with a plurality of solder balls, the bridge in a cavity in the package substrate, and the bridge having sidewalls;
    an encapsulation layer laterally surrounding the bridge in the cavity, the encapsulation layer on the top of the bridge and in contact with the conductive pads of the bridge, the encapsulation layer along less than an entirety of the sidewalls of the bridge, and the encapsulation layer having a bottommost surface above a bottommost surface of the bridge;

a dielectric over the plurality of conductive layers, the plurality of conductive pillars, the bridge, and the solder resist of the package substrate; and a plurality of dies over the package substrate, wherein the plurality of dies are coupled directly to the FLIs with a plurality of conductive bumps, and wherein the plurality of dies are communicatively coupled with the bridge.

11. The semiconductor package of claim 10, wherein the bridge is an EMIB, and wherein the first conductive layer includes a plurality of first conductive pads and a plurality of second conductive pads, and wherein the FLIs include a plurality of first conductive vias, a plurality of second conductive vias, and a plurality of diffusion layers.

12. The semiconductor package of claim 11, wherein the plurality of first conductive pads are coupled to the plurality of diffusion layers with the plurality of first conductive vias, wherein the plurality of second conductive pads are coupled to the plurality of diffusion layers with the plurality of second conductive vias, wherein the plurality of diffusion layers are between the plurality of conductive bumps and the plurality of first and second conductive vias, wherein the plurality of first and second conductive vias have top surfaces and bottom surfaces that are opposite to the top surfaces, and wherein the top surfaces of the plurality of first and second conductive vias are coupled directly to the plurality of diffusion layers.

13. The semiconductor package of claim 12, wherein the top surfaces of the plurality of first and second vias have a width that is less than a width of the bottom surfaces of the plurality of first and second vias.

14. The semiconductor package of claim 11, wherein the plurality of top surfaces of the FLIs are top surfaces of the plurality of diffusion layers, wherein the plurality of first and second conductive pads are on the solder resist, and wherein the plurality of diffusion layers are coupled directly to the plurality of conductive bumps and the plurality of first and second conductive vias.

15. The semiconductor package of claim 11, further comprising:

a conductive ring layer on the solder resist, wherein the conductive ring layer surrounds the plurality of first conductive pads;

a plurality of third conductive pads on a bottom surface of the bridge, and a plurality of fourth conductive pads on a top surface of the bridge, wherein the bottom surface of the bridge is opposite to the top surface of the bridge, and wherein the plurality of third conductive pads of the bridge are coupled directly to the plurality of first conductive pads of the first conductive layer with the plurality of solder bumps;

a first encapsulation layer surrounds the plurality of first conductive pads, the plurality of solder bumps, a portion of the conductive ring layer, and a portion of the bridge; and a second encapsulation layer over the plurality of dies and the package substrate, wherein the second encapsulation layer surrounds the conductive bumps.

16. The semiconductor package of claim 15, wherein the plurality of first conductive vias have a thickness that is substantially equal to a thickness of the plurality of second conductive vias, wherein the conductive ring layer has a thickness that is substantially equal to a thickness of the plurality of first and second conductive pads, and wherein the plurality of first conductive pads have a width that is less than a width of the plurality of second conductive pads.

17. The semiconductor package of claim 16, wherein the wherein the dielectric surrounds the plurality of fourth conductive pads and the top surface of the bridge, wherein the plurality of conductive layers includes a plurality of third vias that are coupled to the plurality of conductive pillars and fourth conductive pads, wherein the conductive ring layer includes one or more conductive materials, wherein the one or more conductive materials include copper, zinc oxide, ferric oxide, or copper oxide, wherein the bridge has a plurality of TSVs coupled to the plurality of third and fourth conductive pads of the bridge, wherein the bridge is coupled to a power source with the plurality of TSVs or a conductive layer of the FLIs when the conductive ring layer is a copper ring layer, and wherein the conductive layer of the FLIs is on and coupled to one or more of the plurality of first vias.

* * * * *